(12) United States Patent
Kim

(10) Patent No.: US 7,538,481 B2
(45) Date of Patent: May 26, 2009

(54) ORGANIC ELECTROLUMINESCENCE DISPLAY WITH AN INSULATING LAYER SELECTIVELY FORMED

(75) Inventor: Sun-Hwa Kim, Suwon-si (KR)

(73) Assignee: Samsung Mobile Display Co., Ltd., Suwon-Si (KR)

( * ) Notice: Subject to any disclaimer, the term of this patent is extended or adjusted under 35 U.S.C. 154(b) by 185 days.

(21) Appl. No.: 11/284,106

(22) Filed: Nov. 22, 2005

(65) Prior Publication Data
US 2006/0119251 A1 Jun. 8, 2006

(30) Foreign Application Priority Data
Nov. 22, 2004 (KR) .................. 10-2004-0095940

(51) Int. Cl.
*H01J 1/62* (2006.01)
*H01J 63/04* (2006.01)
(52) U.S. Cl. .................. 313/500; 313/504; 313/509; 313/506; 257/40; 257/347
(58) Field of Classification Search ......... 313/498–512; 315/169.1, 169.3; 428/690–691, 917; 438/26–29, 438/34, 82; 257/40–49, 72, 98–100, 642–643, 257/759, 347, 50, 59; 427/66, 532–535, 427/539
See application file for complete search history.

(56) References Cited

U.S. PATENT DOCUMENTS

| | | | | |
|---|---|---|---|---|
| 5,405,710 | A * | 4/1995 | Dodabalapur et al. | 428/690 |
| 5,554,911 | A * | 9/1996 | Nakayama et al. | 313/504 |
| 6,072,450 | A * | 6/2000 | Yamada et al. | 345/76 |
| 6,326,936 | B1 * | 12/2001 | Inganas et al. | 345/55 |
| 6,650,045 | B1 * | 11/2003 | Forrest et al. | 313/504 |
| 6,674,106 | B2 * | 1/2004 | Tanaka et al. | 257/222 |
| 6,737,800 | B1 * | 5/2004 | Winters et al. | 313/504 |
| 7,045,861 | B2 * | 5/2006 | Takayama et al. | 257/347 |
| 7,230,271 | B2 * | 6/2007 | Yamazaki et al. | 257/72 |
| 2001/0017371 | A1 * | 8/2001 | Tanaka et al. | 257/59 |

(Continued)

FOREIGN PATENT DOCUMENTS

EP    0 616 488 A2    9/1994

(Continued)

*Primary Examiner*—Sikha Roy
*Assistant Examiner*—Jose M Diaz
(74) *Attorney, Agent, or Firm*—H.C. Park & Associates, PLC

(57) ABSTRACT

An organic electroluminescence display in which an insulating layer underlying a lower electrode is selectively formed in each of R, G, and B sub-pixels to prevent the shifting of chromaticity coordinates and reduce power consumption, and a method of manufacturing the same are provided. The organic electroluminescence display includes a substrate including a plurality of sub-pixel regions, each of the sub-pixel regions include including an emitting region and a non-emitting region and emits a predetermined color of light, a plurality of driving units provided in the non-emitting region of each sub-pixel region, a plurality of pixel electrodes provided in the emitting region of each sub-pixel region and connected with one of the respective driving units, and an insulating layer provided under the pixel electrodes, wherein the insulating layer is provided on an entire surface of the substrate except for at least one of the emitting regions in the sub-pixel regions.

40 Claims, 10 Drawing Sheets

U.S. PATENT DOCUMENTS

| | | | |
|---|---|---|---|
| 2002/0101152 A1 | 8/2002 | Kimura | |
| 2005/0099118 A1* | 5/2005 | Kobayashi | 313/506 |
| 2005/0140277 A1* | 6/2005 | Suzuki et al. | 313/504 |
| 2005/0225232 A1* | 10/2005 | Boroson et al. | 313/504 |
| 2006/0290274 A1* | 12/2006 | Oota | 313/506 |
| 2007/0001570 A1* | 1/2007 | Nomura et al. | 313/113 |

FOREIGN PATENT DOCUMENTS

| | | |
|---|---|---|
| EP | 0 616 488 A3 | 9/1994 |
| EP | 0 654 833 B1 | 7/1998 |
| JP | 2001-071558 | 3/2001 |
| JP | 2001-242803 | 9/2001 |
| JP | 2004-158469 | 6/2004 |
| JP | 2004-296303 | 10/2004 |
| KR | 10-2003-0070726 | 9/2003 |
| WO | 98/28947 | 7/1998 |
| WO | 00/76010 | 12/2000 |
| WO | WO 2004026004 A1 * | 3/2004 |

* cited by examiner

ORGANIC ELECTROLUMINESCENCE DISPLAY WITH AN INSULATING LAYER SELECTIVELY FORMED

BACKGROUND OF THE INVENTION

This application claims the priority of Korean Patent Application No. 10-2004-0095940, filed on Nov. 22, 2004, in the Korean Intellectual Property Office, which is hereby incorporated by reference for all purposes as if fully set forth herein.

1. Field of the Invention

The present invention relates to a flat display, and more particularly, to an organic electroluminescence display having an insulating layer selectively formed below a pixel electrode of each of red (R), green (G), and blue (B) sub-pixels.

2. Description of the Related Art

Organic electroluminescence displays include a plurality of pixels arranged in a matrix or array on a substrate, wherein each of the pixels includes R, G, and B sub-pixels. Each of the R, G, and B sub-pixels includes an electroluminescence (EL) unit including an anode electrode, a cathode electrode, an emissive layer provided between the anode and cathode electrodes, and a thin film transistor (TFT) driving the EL unit. As a voltage is applied across the anode and cathode electrodes, light emits from the emissive layer toward or away from the substrate, thereby displaying images.

In a conventional rear-type organic EL display emitting light from an organic emissive layer toward a substrate, light emitted from the organic emissive layer travels through the substrate via insulating layers, such as a protective layer, an interlayer insulating layer, a gate dielectric layer, and a buffer layer, which underlay the organic emissive layer. Therefore, different color light beams emitted from the organic emissive layer through the substrate have inconsistent chromaticity coordinates.

In an active matrix organic EL display using a TFT as a switching device, a plurality of pixels are arranged in a matrix on a substrate, wherein each of the pixels includes R, G, and B sub-pixels. Each of the R, G, and B sub-pixels includes one capacitor, an EL unit, and at least two TFTs, for example, a switching TFT and a driving TFT.

FIG. 1 is a sectional view of a conventional organic EL display including thin film transistors. In FIG. 1, for purposes of convenience, only organic EL units and driving TFTs in the R, G, and B sub-pixels, which are part of each pixel of the organic EL display, are illustrated.

Referring to FIG. 1, a substrate 100 includes an R pixel region 100R, a G pixel region 100G, and a B pixel region 100B. An R sub-pixel 10R is formed in the R pixel region 100R of the substrate 100, a G sub-pixel 10G is formed in the G pixel region 100G, and a B sub-pixel 10B is formed in the B pixel region 100B.

The R sub-pixel 10R includes an R EL unit and a TFT driving the R EL unit. The TFT includes a semiconductor layer 111, which is formed on a buffer layer 105 and has a source/drain region 112 and 113, a gate electrode 121 formed on a gate dielectric layer 120, and source/drain electrode 142 and 143 formed on an interlayer insulating layer 130 and connected with the source/drain region 112 and 113, respectively, via contact holes 132 and 133.

The R EL unit includes an anode electrode 161, which is a pixel electrode formed on a protective layer 150 and connected with the drain electrode 143 through a via hole 151, an organic layer 181 formed on the anode electrode 161 exposed by an opening 171 formed in a pixel isolating layer 170, and a cathode electrode 190 formed over or on a top surface of the substrate.

Similarly, the G sub-pixel 10G includes a G EL unit and a TFT driving the G EL unit. The TFT includes a semiconductor layer 114, which is formed on the buffer layer 105 and has a source/drain region 115 and 116, a gate electrode 124 formed on the gate dielectric layer 120, and a source/drain electrode 145 and 146 formed on the interlayer insulating layer 130 and connected with the source/drain region 115 and 116, respectively, via contact holes 135 and 136.

The G EL unit includes an anode electrode 164, which is a pixel electrode formed on the protective layer 150 and connected with the drain electrode 146 via a via hole 154, an organic layer 184 formed on the anode electrode 164 exposed by an opening 174 formed in the pixel isolating layer 170, and the cathode electrode 190 formed over or on a top surface of the substrate.

Similarly, the B sub-pixel 10B includes a B EL unit and a TFT driving the B EL unit. The TFT includes a semiconductor layer 117, which is formed on the buffer layer 105 and has a source/drain region 118 and 119, a gate electrode 127 formed on the gate dielectric layer 120, and a source/drain electrode 148 and 149 formed on the interlayer insulating layer 130 and connected with the source/drain region 118 and 119, respectively, via contact holes 138 and 139.

The B EL unit includes an anode electrode 167, which is a pixel electrode formed on the protective layer 150 and connected with the drain electrode 149 via a via hole 157, an organic layer 187 formed on the anode electrode 167 exposed by an opening 177 formed in the pixel isolating layer 170, and the cathode electrode 190 formed over or on a top surface of the substrate.

In a conventional organic EL display having the above-described structure, or a structure similar thereto, the protective layer 150 having a uniform thickness over the substrate underlies, e.g., is positioned beneath, the respective pixel electrodes 161, 164, and 167 of the R, G, and B sub-pixels 10R, 10G, and 10B.

However, in the above-described organic EL display, when the protective layer 150 having a uniform thickness is formed over the substrate, the chromaticity coordinate for B light shifts, thereby resulting in a narrower B chromaticity area, which is not suitable. In contrast, when the protective layer 150 is not formed, the chromaticity coordinate for B light may be suitable, however, the chromaticity coordinate for G light shifts, thereby unsuitably narrowing the G chromaticity area, which is not suitable.

U.S. Pat. No. 6,674,106 discloses an organic EL display that improves optical characteristics of light emitted from an organic emissive layer. The organic EL display includes a plurality of pixels arranged in a matrix on a substrate. The substrate includes an opening region, in which EL units acting as display units are arranged, and a non-opening region, in which thin film transistors for driving the EL units are arranged. By selectively removing the insulating layers underlying the pixel electrodes, i.e., regions of the gate dielectric layer and interlayer insulating layer corresponding to the opening region, which is a light emitting region, the refractive index in the opening region is adjusted to be nearly the same as the refractive index in the substrate, thereby improving the optical characteristics in the opening region.

In the above-described conventional organic EL display, the optical characteristics in the opening region may be improved by removing the regions of the gate dielectric layer and interlayer insulating layer that are aligned with the opening region. However, since the regions of the gate dielectric layer and interlayer insulating layer, which are aligned with the opening region and underlay the pixel electrode of each of the R, G, and B sub-pixels, are removed to allow light emitted from the organic layer to go through the substrate, an optical path cannot be controlled for individual R, G, and B sub-pixels.

Korean Patent Laid-open No. 2003-70726 discloses a rear emission type organic EL display in which a total thickness of insulating layers underlying an anode (pixel) electrode, such as a buffer layer, a gate dielectric layer, an interlayer insulating layer, a protective layer, etc., is controlled such that a chromaticity coordinate or light emitted from an organic emissive layer is improved, e.g., the chromaticity coordinate is optional.

In the organic EL display, for example, the chromaticity coordinate of light emitted from the organic emissive layer is optimal when the total thickness of the insulating layers underlying the anode electrode is approximately 2,500-3,500 Å. However, since the thickness of the insulating layers provided below the anode electrode is uniform over the substrate, light emitted from the organic layers of all the R, G, and B sub-pixels travels through the substrate via a common optical path. Therefore, the optical path cannot be controlled for individual R, G, and B sub-pixels.

SUMMARY OF THE INVENTION

The present invention provides an organic EL display in which an insulating layer underlying pixel electrodes of R, G, and B sub-pixels is selectively formed in each of the sub-pixels to prevent chromaticity coordinates from shifting. The present invention provides an organic EL display in which the thickness of an insulating layer underlying pixel electrodes of R, G, and B sub-pixels is controlled to increase chromaticity area and reduce power consumption. According to an embodiment of the invention, there is provided an organic electroluminescence display in which an insulating layer underlying a lower electrode is selectively formed in each of R, G, and B sub-pixels to prevent the shifting of chromaticity coordinates and reduce power consumption, and a method of manufacturing the same are provided. The organic electroluminescence display includes a substrate including a plurality of sub-pixel regions, each of the sub-pixel regions include an emitting region and a non-emitting region, a driving unit provided in the non-emitting region of each sub-pixel region, a pixel electrode provided in the emitting region of each sub-pixel region and connected with one of the driving unit, and an insulating layer provided under the pixel electrodes, wherein the insulating layer is provided on an entire surface of the substrate except for at least one of the emitting regions in the sub-pixel regions.

According to an embodiment of the invention, there is provided a flat panel display including a substrate including R, G, and B sub-pixel regions, each of the R, G, and B sub-pixel regions including an emitting region and a non-emitting region, R, G, and B pixel electrodes provided in the respective emitting regions of the R, G, and B sub-pixel regions, R, G, and B driving units provided in the respective non-emitting regions of the R, G, and B sub-pixel regions and driving the respective R, G, and B pixel electrodes, and an insulating layer provided between the R, G, and B driving units and the R, G, and B pixel electrodes, wherein the insulating layer is provided on an entire surface of the substrate except for at least one of the emitting regions in the R, G, and B sub-pixel regions.

According to an embodiment of the invention, there is provided a flat panel display including a substrate including R, G, and B sub-pixel regions, each of the R, G, and B sub-pixel regions includes an emitting region and a non-emitting region, R, G, and B pixel electrodes provided in the respective emitting regions of the R, G, and B sub-pixel regions, R, G, and B driving units provided in the respective non-emitting regions of the R, G, and B sub-pixel regions, each of the R, G, and B sub-pixel regions includes driving electrodes to drive respective R, G, and B pixel electrodes, and an insulating layer provided on the substrate and having the driving electrodes formed thereon, wherein the R, G, and B pixel electrodes are provided on the insulating layer and are connected with the respective driving electrodes, and wherein the insulating layer is provided on an entire surface of the substrate except for at least one of the emitting regions in the R, G, and B sub-pixel regions.

According to an embodiment of the invention, there is provided an organic electroluminescence display including a substrate including R, G, and B sub-pixel regions, each of the R, G, and B sub-pixel regions includes an emitting region and a non-emitting region, R, G, and B thin film transistors provided in the respective non-emitting regions of the R, G, and B sub-pixel regions, each of the R, G, and B thin film transistors includes a semiconductor layer, a gate electrode, and source/drain electrodes, an insulating layer including R, G, and B via holes exposing one of the source/drain electrodes of the respective R, G, and B thin film transistors, and R, G, and B electroluminescence units formed in the respective emitting regions of the R, G, and B sub-pixel regions and including R, G, and B pixel electrodes, respectively, which are connected with one of the source/drain electrodes of the respective R, G, and B thin film transistors through the respective R, G, and B via holes, wherein the insulating layer is provided on an entire surface of the substrate except for at least one of the emitting regions of the R, G, and B sub-pixel regions.

According to an embodiment of the invention, there is provided an organic electroluminescence display including a substrate including R, G, and B sub-pixel regions, each of the R, G, and B sub-pixel regions includes an emitting region and a non-emitting region, R, G, and B thin film transistors provided in the respective non-emitting regions of the R, G, and B sub-pixel regions, each of the R, G, and B thin film transistors includes a semiconductor layer, a gate electrode, and source/drain electrodes, R, G, and B electroluminescence units provided in the respective emitting regions of the R, G, and B sub-pixel regions and including R, G, and B pixel electrodes, respectively, which are connected with one of the source/drain electrodes of the respective R, G, and B thin film transistors, and an insulating layer selectively formed below at least one of the R, G, and B pixel electrodes.

According to an embodiment of the invention, there is provided an organic electroluminescence display including a substrate including R, G, and B sub-pixel regions, each of the sub-pixel regions includes an emitting region and a non-emitting region, R, G, and B thin film transistors provided in the respective non-emitting regions of the R, G, and B sub-pixel regions, each of the R, G, and B thin film transistors includes a semiconductor layer, a gate electrode, and source/drain electrodes, R, G, and B electroluminescence units provided in the respective emitting regions of the R, G, and B sub-pixel regions and including R, G, and B pixel electrodes, respectively, which are connected with one of the source/drain electrodes of the respective R, G, and B thin film transistors, and an insulating layer formed below the source/drain electrodes, wherein the R, G, and B pixel electrodes are provided on the insulating layer and are connected with the one of the source/drain electrodes of the respective R, G, and B thin film transistors, and wherein the insulating layer is provided on an entire surface of the substrate except for at least one of the emitting regions of the R, G, and B sub-pixel regions.

According to an embodiment of the invention, there is provided an organic electroluminescence display including a substrate including R, G, and B sub-pixel regions, each of the sub-pixel regions includes an emitting region and a non-emitting region, R, G, and B thin film transistors provided in the respective non-emitting regions of the R, G, and B sub-pixel regions, each of the R, G, and B thin film transistors includes a semiconductor layer, a gate electrode, and source/drain electrodes, R, G, and B electroluminescence units provided in the respective emitting regions of the R, G, and B sub-pixel regions and including R, G, and B pixel electrodes, respectively, and an insulating layer provided below the source/drain electrodes of the R, G, and B thin film transistors, wherein the R, G, and B pixel electrodes extend from one of the source/drain electrodes of the respective R, G, and B thin film transistors, and wherein the insulating layer is formed on an entire surface of the substrate except for at least one of the emitting regions of the R, G, and B sub-pixel regions.

According to an embodiment of the invention, there is provided a method of forming a flat panel display including forming a plurality of sub-pixel regions on a substrate, each of the sub-pixel regions include includes an emitting region and a non-emitting region and emits a predetermined color of light, forming a driving unit in the non-emitting region of each sub-pixel region, forming a pixel electrode in the emitting region of each sub-pixel region and connecting each pixel electrode with the driving unit, and forming an insulating layer under the pixel electrodes on an entire surface of the substrate except for at least one of the emitting regions in the sub-pixel regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

Figure 1:
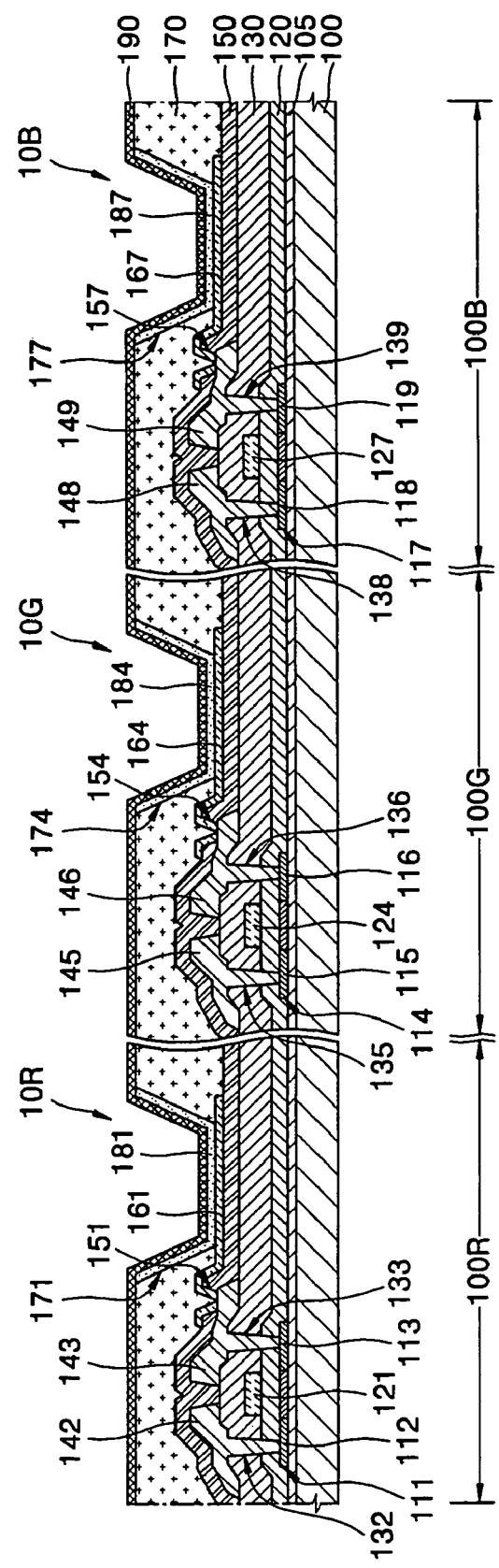
FIG. 1 is a sectional view of a conventional organic electroluminescence (EL) display.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It is understood that when an element or layer is referred to as being "on" or "connected to" or "connected with" another element or layer, it can be directly on or directly connected to or with the other element or layer or intervening elements or layers may be present.

Figure 2A:
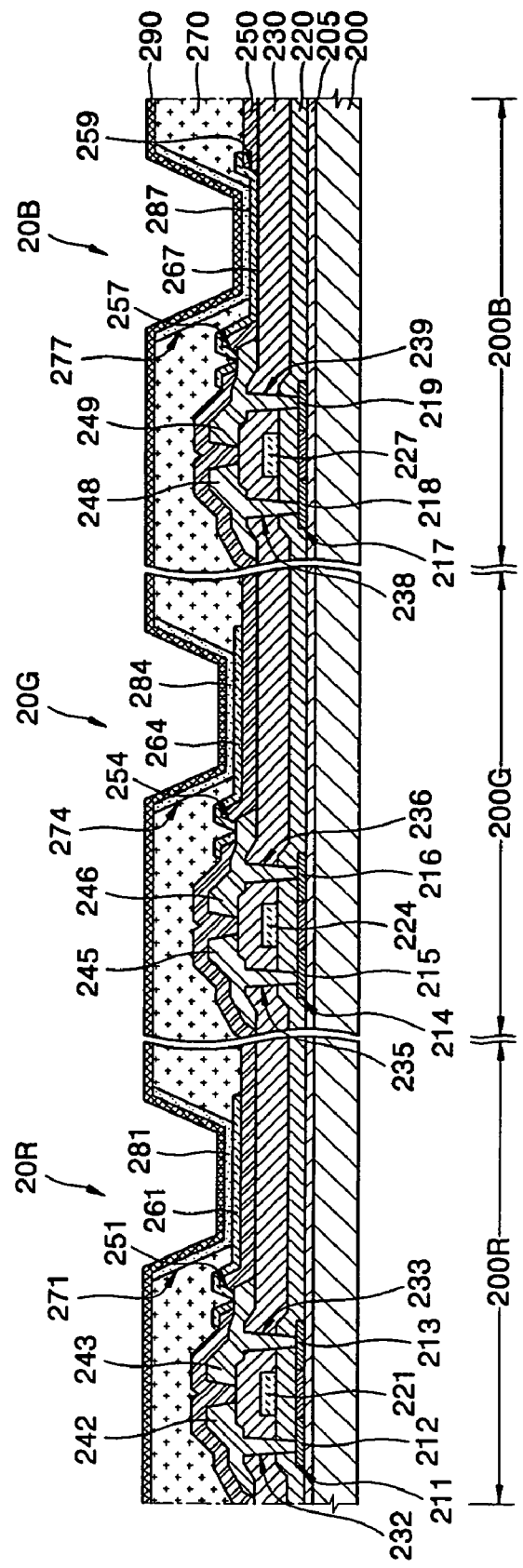
FIG. 2A is a sectional view of an organic EL display according to an embodiment of the invention.

FIG. 2A is a sectional view of an organic electroluminescence (EL) display according to an embodiment of the invention. In FIG. 2A, for purposes of convenience, only an EL unit and a TFT, which drives the EL unit, are illustrated in each of R, G, and B sub-pixels forming one pixel.

Referring to FIG. 2A, the organic EL display includes a plurality of pixels arranged in a matrix or array on a substrate 200. The pixels each include a red (R) sub-pixel 20R, a green (G) sub-pixel 20G, and a blue (B) sub-pixel 20B. The substrate 200 includes an R sub-pixel region 200R, where the R sub-pixel 20R is formed, a G sub-pixel region 200G, where the G sub-pixel 20G is formed, and a B sub-pixel region 200B, where the B sub-pixel 20B is formed.

The R, G, and B sub-pixel regions 200R, 200G, and 200B each include an emitting region and a non-emitting region. An emitting region of the R sub-pixel region 200R is a region where an R EL unit is formed and light generated in the R EL unit is emitted. A non-emitting region of the R sub-pixel region 200R is a region where a TFT driving the R EL unit is formed. Likewise, an emitting region of the G sub-pixel region 200G is a region where a G EL unit is formed and light generated from the G EL unit is emitted. A non-emitting region of the G sub-pixel region 200G is a region where a TFT driving the G EL unit is formed. Likewise, an emitting region of the B sub-pixel region 200B is a region where a B EL unit is formed and light generated from the B EL unit is emitted. A non-emitting region of the B sub-pixel region 200B is a region where a TFT driving the B EL unit is formed.

A buffer layer 205 is formed on or directly on the substrate 200, and semiconductor layers 211, 214, and 217 are formed on the non-emitting regions of the R, G, and B sub-pixel regions 200R, 200G, and 200B, respectively. The semiconductor layer 211 for a TFT of the R sub-pixel 20R, has a predetermined type of conductivity, and includes, for example, p-type, source/drain regions 212 and 213. The semiconductor layer 214 for a TFT of the G sub-pixel 20G, includes, for example, p-type source/drain regions 215 and 216. The semiconductor layer 217 for a TFT of the B sub-pixel 20B, includes, for example, p-type source/drain regions 218 and 219.

A gate dielectric layer 220 is formed over and/or around the semiconductor layers 211, 214, and 217 and the substrate 200. Gate electrodes 221, 224, and 227 of the respective thin film transistors of the R, G, and B sub-pixels 20R, 20G, and 20B are formed on or directly on the gate dielectric layer 220 at the respective R, G, and B sub-pixel regions 200R, 200G, and 200B.

An interlayer insulating layer 230 is formed over and/or around the gate electrodes 221, 224, and 227 and the gate dielectric layer 220. The interlayer insulating layer 230 includes contact holes 232 and 233 exposing portions of the source/drain regions 212 and 213 of the R sub-pixel 20R, contact holes 235 and 236 exposing portions of the source/drain regions 215 and 216 of the G sub-pixel 20G, and contact holes 238 and 239 exposing portions of the source/drain regions 218 and 219 of the B sub-pixel 20B.

Source/drain electrodes 242 and 243 for the TFT of the R sub-pixel 20R, source/drain electrodes 245 and 246 for the TFT of the G sub-pixel 20G, and source/drain electrodes 248 and 249 for the TFT of the B sub-pixel 20B are formed on or directly on the interlayer insulating layer 230. The source/drain electrodes 242 and 243 of the R sub-pixel 20R are connected with the source/draw regions 212 and 213 via the contact holes 232 and 233. Similarly, the source/drain electrodes 245 and 246 of the G sub-pixel 20G are connected with the source/drain regions 215 and 216 via the contact holes 235 and 236. Similarly, the source/drain electrodes 248 and 249 of the B sub-pixel 20B are connected with the source/drain regions 218 and 219 via the contact holes 238 and 239.

A protective layer 250, which is made of, for example, silicon nitride, is subsequently formed on or directly on the substrate 200. As shown in FIG. 2A, the protective layer 250 includes a via hole 251 exposing a portion of the drain electrode 243 of the R sub-pixel 20R, a via hole 254 exposing a portion of the drain electrode 246 of the G sub-pixel 20G, and a via hole 257 exposing a portion of the drain electrode 249 of the B sub-pixel 20B. The protective layer 250 further includes an opening 259 in a region corresponding to the emitting region of the B sub-pixel region 200B.

Anode electrodes 261, 264, and 267, which are pixel electrodes of the respective R, G, and B pixels 20R, 20G, and 20B, are formed on or directly on the protective layer 250. The anode electrode 261 of the R sub-pixel 20R is formed on the emitting region of the R sub-pixel region 200R and is connected to with the drain electrode 243 through the via hole 251. Similarly, the anode electrode 264 of the G sub-pixel 20G is formed on the emitting region of the G sub-pixel region 200G and is connected to with the drain electrode 246 through the via hole 254. The anode electrode 267 of the B sub-pixel 20B is formed on a region of the protective layer 250 in which the opening 259 is formed, which corresponds with the emitting region of the B sub-pixel region 200B, and is connected with the drain electrode 249.

According to an embodiment of the invention, the organic EL display may be manufactured without an additional masking processes. For example, when etching the protective layer 250 to form the via holes 251, 254, and 257, the opening 259 may be simultaneously formed Thus, the protective layer 250 is selectively formed only in the emitting regions of the respective R, G, and B sub-pixel regions 200R, 200G, and 200B.

A pixel isolating layer 270 is subsequently formed on the substrate 200. The pixel isolating layer 270 includes an opening 271 exposing a portion of the anode electrode 261 of the R sub-pixel 20R, an opening 274 exposing a portion of the anode electrode 264 of the G sub-pixel 20G, and an opening 277 exposing a portion of the anode electrode 267 of the B sub-pixel 20B.

An organic layer 281, 284, and 287 is subsequently formed on a region of the anode electrode 261 of the R sub-pixel 20R that is exposed by the opening 271, a region of the anode electrode 264 of the G sub-pixel 20G that is exposed by the opening 274, and a region of the anode electrode 267 of the B sub-pixel 20B that is exposed by the opening 277, respectively.

A cathode electrode 290 is formed on the substrate 200 as an upper electrode.

The organic layers 281, 284, and 287 of the respective R sub-pixel 20R, G sub-pixel 20G, and B sub-pixel 10B, each include at least one of the following organic layers: a hole injecting layer, a hole transporting layer, an electron transporting layer, an electron injecting layer, a hole blocking layer, and/or a R emissive layer, G emissive layer, or B emissive layer.

According to the embodiment of the invention described above, the R sub-pixel 20R includes an R EL unit and a TFT. The R EL unit of the R sub-pixel 20R includes the anode electrode 261 formed on or directly on the protective layer 250 in the emitting region of the R sub-pixel region 200R, the organic layer 281, and the cathode electrode 290. The TFT of the R sub-pixel 20R includes the semiconductor layer 211, the gate electrode 221, and the source/drain electrodes 242 and 243, which are formed on the substrate 200 in the non-emitting region of the R sub-pixel region 200R. The drain electrode 243 is connected with the anode electrode 261 of the R EL unit.

Similarly, the G sub-pixel 20G includes the G EL unit and the TFT. The G EL unit of the G sub-pixel 20G includes the anode electrode 264 formed on or directly on the protective layer 250 in the emitting region of the G sub-pixel region 200G, the organic layer 284, and the cathode electrode 290. The TFT of the G sub-pixel 20G includes the semiconductor layer 214, the gate electrode 224, and the source/drain electrodes 245 and 246, which are formed on the substrate 200 in the non-emitting region of the G sub-pixel region 200G. The drain electrode 246 is connected with the anode electrode 264 of the G EL unit.

Similarly, the B sub-pixel 20B includes the B EL unit and the TFT. The B EL unit of the B sub-pixel 20B includes the anode electrode 267 formed on or directly on the opening 259 of the protective layer 250 in the emitting region of the B sub-pixel region 200B, the organic layer 287, and the cathode electrode 290. The TFT of the B sub-pixel 20B includes the semiconductor layer 217, the gate electrode 227, and the source/drain electrodes 248 and 249, which are formed on the substrate 200 in the non-emitting region of the B sub-pixel region 200B. The drain electrode 249 is connected with the anode electrode 267 of the B EL unit.

Thus, for example, the anode electrodes 261, 264, and 267 of the respective R sub-pixel 20R, G sub-pixel 206, and B sub-pixel 20B, which together form one pixel, are each formed on or directly on the protective layer 250. Specifically, for example, the anode electrode 261 of the sub-pixel 20R is formed on the protective layer 250 in the emitting region of the R sub-pixel region 200R. The anode electrode 264 of the G sub-pixel 20G is formed on the protective layer 250 in the emitting region of the G sub-pixel region 200G. The anode electrode 267 of the B sub-pixel 20B is formed in the emitting region of the B sub-pixel region 200B, however, unlike the R and G sub-pixels 20R and 20G, the B sub-pixel 20B is formed in the opening 259 of the protective layer 250. In particular, a portion of the anode electrode 267 of the B sub-pixel 20B corresponding to the organic layer 287 is formed on a portion of the interlayer insulating layer 230 exposed by the opening 259.

According to the above described embodiment of the invention, in the R and G sub-pixels 20R and 20G, light generated in the organic layers 281 and 284 of the R and G sub-pixels 20R and 20G emits toward the substrate 200 through the protective layer 250. Light generated in the organic layer 287 of the B sub-pixel 20B emits toward the substrate 200 through the opening 259 of the protective layer 250, e.g., not through the protective layer 250.

Table 1 shown below is a table of X and Y chromaticity coordinates for R, G, and B sub-pixels 20R, 20G, and 20B of an organic EL display where each of the R, G, and B sub-pixels includes a protective layer and X and Y chromaticity coordinates for the R, G and B sub-pixels of an organic EL display where none of the R, G, and B sub-pixels 20R, 20G, and 20B includes a protective layer.

Figure 6:
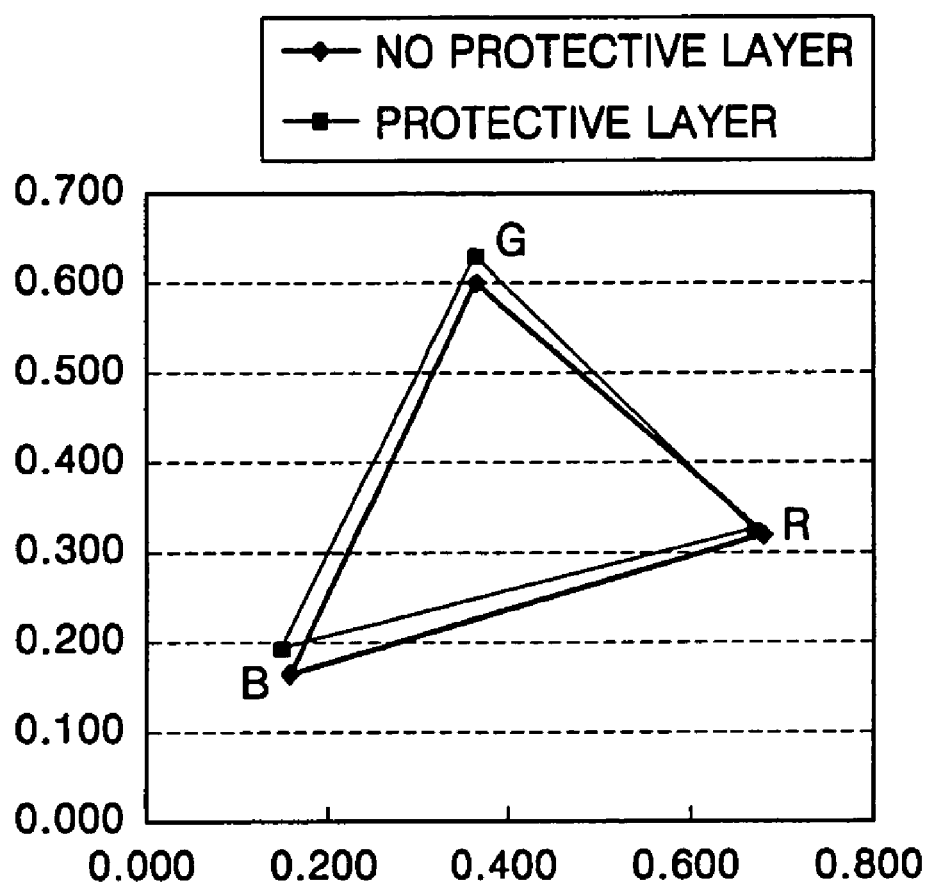
FIG. 6 is a graph of chromaticity coordinates of organic EL displays having a protective layer, and organic EL displays not having the protective layer.

Similarly, FIG. 6 is a graph illustrating the X and Y chromaticity coordinates of the organic EL display having the protective layer formed in each of the R, G, and B sub-pixels 20R, 20G, and 20B and the X and Y chromaticity coordinates of the organic EL display having no protective layer formed in any of the R, G, and B sub-pixels 20R, 20G, and 20B.

In Table 1 and FIG. 6, comparing the organic EL display having the protective layer 150, which, for example, has a thickness of approximately 6000 Å, for each of the R, G, and B sub-pixel regions 200R, 200G, and 200B, with the organic EL display having no protective layer in any of the R, G, and B sub-pixel regions 200R, 200G, and 200B, the chromaticity coordinates of R are substantially constant regardless of the presence of the protective layer 250.

The chromaticity coordinate of G improves when there is a protective layer 250. However, the chromaticity coordinate of B improves when there is no protective layer.

Thus, for example, superior chromaticity coordinates may be obtained by forming the protective layer 250 in the G sub-pixel region 200G and not forming the protective layer 250 in the B sub-pixel region 200B. As a result, the chromaticity area may also be increased.

TABLE 1

|  | color | X coordinate | Y coordinate |
| --- | --- | --- | --- |
| No protective layer formed | R | 0.682 | 0.317 |
|  | G | 0.360 | 0.595 |
|  | B | 0.158 | 0.159 |
| Protective layer formed | R | 0.670 | 0.320 |
|  | G | 0.360 | 0.630 |
|  | B | 0.150 | 0.190 |

According to an embodiment of the present invention, the protective layer 250 is provided under the anode electrodes of the R and B sub-pixels 20R and 20G, which require the protective layer 250 for superior chromaticity coordinates, and is not provided under the anode electrode of the B sub-pixel 20B, which, as discussed above does not require the protective layer 250 for superior chromaticity coordinates. As such, by selectively forming the protective layer under the anode electrodes 261, 264, and 267 of the respective R, G, and B sub-pixels 20R, 20G, and 20B, the chromaticity area may be increased.

It is understood that the chromaticity area may be increased by forming the protective layer 250 with varying thicknesses in the respective R and G sub-pixel regions 200R and 200G.

Figure 2B:
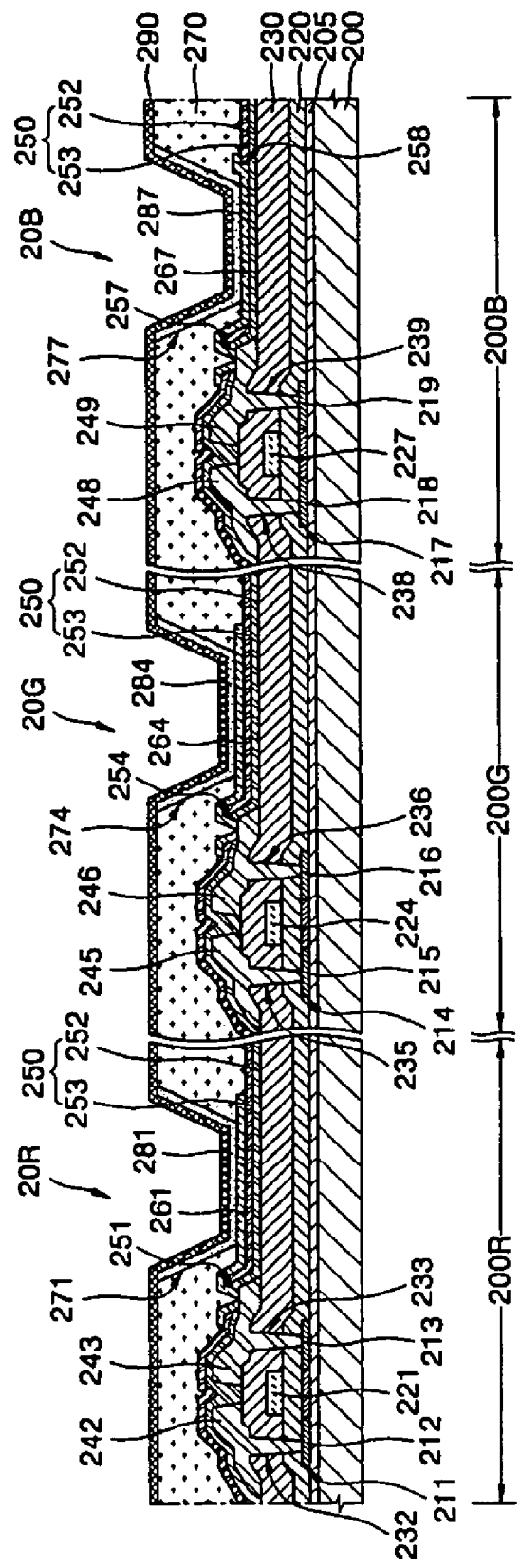
FIG. 2B is another sectional view of the organic EL display of FIG. 2A.

FIG. 2B is a sectional view of an organic EL display according to another embodiment of the invention. In FIG. 2B, for convenience purposes, only an EL unit and a TFT are illustrated in each of R, G, and B sub-pixels that combine to form one pixel. The cross-section of the organic EL display in FIG. 2B is substantially the same as the cross-section of the organic EL display in FIG. 2A, except that the protective layer is a double layer structure.

Referring to FIG. 2B, the R, G, and B sub-pixels 20R, 20G, and 20B, which combine to form one pixel, are formed in the R, G, and B sub-pixel regions 200R, 200G, and 200B of the substrate 200, respectively.

The R sub-pixel 20R in the R sub-pixel region 200R includes a TFT, which includes the semiconductor layer 211, the gate electrode 221, and the source/drain electrodes 242 and 243 formed in a non-emitting region and an R EL unit, which includes the anode electrode 261, the organic layer 281, and the cathode electrode 290 formed on or directly on the protective layer 250 in an emitting region.

Similarly, the G sub-pixel 20G in the G sub-pixel region 200G includes a TFT, which includes the semiconductor layer 214, the gate electrode 224, and the source/drain electrodes 245 and 246 formed in a non-emitting region and a G EL unit, which includes the anode electrode 264, the organic layer 284, and the cathode electrode 290 formed on or directly on the protective layer 250 in an emitting region.

The B sub-pixel 20B in the B sub-pixel region 200B includes a TFT, which includes the semiconductor layer 217, the gate electrode 227, and the source/drain electrodes 248 and 249 formed in a non-emitting region and a B EL unit, which includes the anode electrode 267, the organic layer 287, and the cathode electrode 290 formed on or directly on the protective layer 250 in an emitting region.

The protective layer 250 formed between the EL units and the TFTs includes a first protective layer 252 formed on or directly on the interlayer insulating layer 230 and a second protective layer 253 formed on or directly on the first protective layer 252 and having an opening 258 in a region corresponding to the anode electrode 267 of the B sub-pixel 20B. The first protective layer 252 may be an insulating layer, such as an oxide layer, and the second protective layer 253 may be an insulating layer, such as a nitride layer, or vice-versa.

The protective layer 250, which includes the first protective layer 252 and the second protective layer 253, is formed under the anode electrode 261 of the R sub-pixel 20R and the anode electrode 264 of the G sub-pixel 20G. In the B sub-pixel region 200B, the protective layer 250 which includes the first protective layer 252, the second protective layer 253, and the opening 258 in the region corresponding to the anode electrode 267 of the B sub-pixel 20B is formed. The second protective layer 253 of the protective layer 250 is selectively formed in the emitting regions of the respective R, G, and B sub-pixel regions 200R, 200G, and 200B.

Although the anode electrode 267 of the B sub-pixel 20B is formed in the opening 258 of the protective layer 50, a portion of the anode electrode 267 of the B sub-pixel 20B corresponding to the organic layer 287 is formed on the first protective layer 252.

Therefore, light generated in the organic layers 281 and 284 of the respective R and G sub-pixels 20R and 20G is emitted toward the substrate 200 through both of the first protective layer 252 and the second protective layer 253, and light generated in the organic layer 287 of the B sub-pixel 20B is emitted toward the substrate 200 through the first protective layer 252 and not through the second protective layer 253.

It is understood that the opening 258 may be formed through the first protective layer 252 and the second protective layer 253 in the B sub-pixel 20B such that light is not emitted through either the first protective layer 252 or the second protective layer 253.

According to an embodiment of the invention, the organic EL display shown in FIG. 2B maybe manufactured without any additional masking process. For example, when etching the first protective layer 252 and the second protective layer 253 so as to form the via holes 251, 254, and 257, the opening 258 can be simultaneously formed in the protective layer 250. Alternatively, the via holes 251, 254, and 257 and the opening 258 of the second protective layer 253 in the B sub-pixel region 200B can be simultaneously formed using, for example, a halftone mask.

Figure 3A:
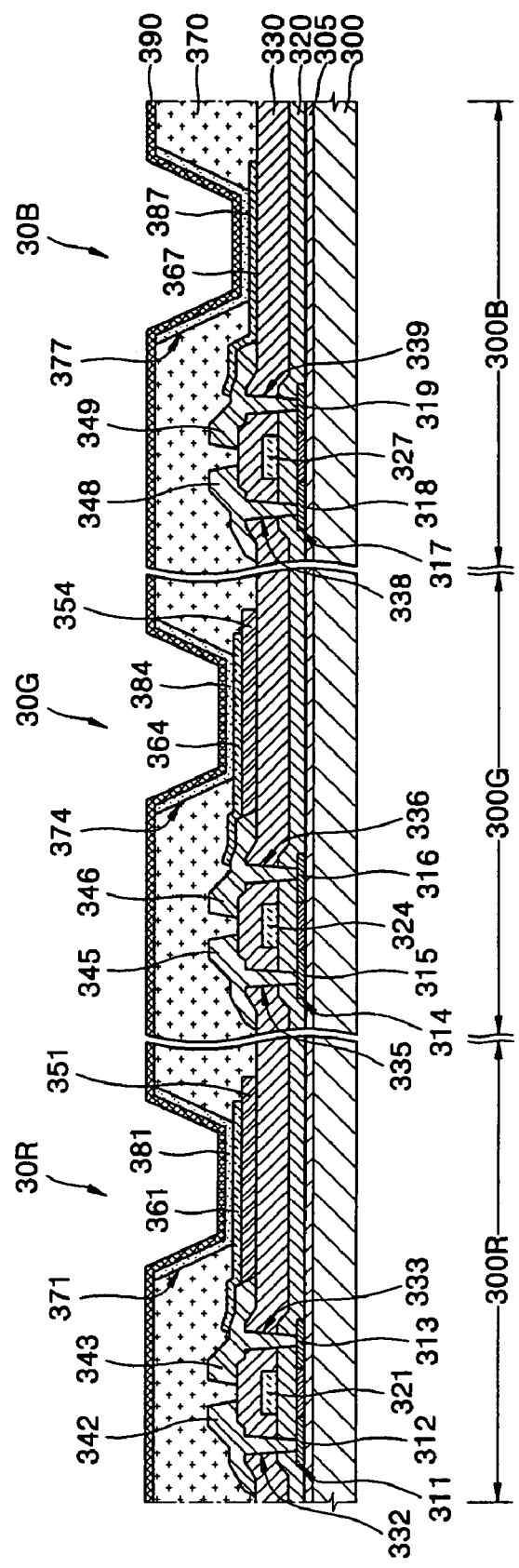
FIG. 3A is a sectional view of an organic EL display according to another embodiment of the invention.

FIG. 3A is a sectional view of an organic EL display according to another embodiment of the invention. In FIG. 3A, for purposes of convenience, only an EL unit and a TFT, are illustrated in each of R, G, and B sub-pixels 30R, 30G, and 30B that combine to form one pixel.

In the organic EL displays described in the above embodiments according to the present invention, a structure for superior chromaticity coordinates is obtained by selectively removing the protective layer from each of the R, G, and B sub-pixels 30R, 30G, and 30B. However, according to an embodiment of the invention discussed below, the organic EL includes a structure having superior chromaticity coordinates that is obtained by selectively forming a protective layer in each of the R, G, and B sub-pixels 30R, 30G, and 30B.

Referring to FIG. 3A, the organic EL display shown includes a plurality of pixels arranged in a matrix on a substrate 300. Each of the pixels includes an R sub-pixel 30R, a G sub-pixel 30G, and a B sub-pixel 30B. The substrate 300 includes an R sub-pixel region 300R having the R sub-pixel 30R, a G sub-pixel region 300G having the G sub-pixel 30G, and a B sub-pixel region 300B having the B sub-pixel 30B. Each of the R, G, and B sub-pixel regions 300R, 300G, and 300B includes an emitting region and a non-emitting region.

A buffer layer 305 is formed on the substrate 300, and semiconductor layers 311, 314, and 317 are formed on or directly on the buffer layer 305 in the non-emitting regions of the R, G, and B sub-pixel regions 300R, 300G, and 300B, respectively. The semiconductor layer 311 for a TFT of the R sub-pixel 30R includes p-type source/drain regions 312 and 313. Similarly semiconductor layer 314 for a TFT of the G sub-pixel 30G includes p-type source/drain regions 315 and 316. Similarly, semiconductor layer 317 for a TFT of the B sub-pixel 30B includes p-type source/drain regions 318 and 319.

A gate dielectric layer 320 is formed on the substrate 300. Gate electrodes 321, 324, and 327 of the respective R, G, and B sub-pixels 30R, 30G, and 30B are formed on or directly on the gate dielectric layer 320 in the respective R, G, and B sub-pixel regions 300R, 300G, and 300B.

An interlayer insulating layer 330 is formed on the substrate 300 over the gate dielectric layer 320. The interlayer insulating layer 330 includes contact holes 332 and 333, which expose portions of the source/drain regions 312 and 313 formed on the semiconductor layer 311 of the R sub-pixel 30R, contact holes 335 and 336, which expose portions of the source/drain regions 315 and 316 formed on the semiconductor layer 314 of the G sub-pixel 30G, and contact holes 338 and 339, which expose portions of the source/drain regions 318 and 319 formed on the semiconductor layer 317 of the B sub-pixel 30B.

Source/drain electrodes 342 and 343 of the R sub-pixel 30R, source/drain electrodes 345 and 346 of the G sub-pixel 30G, and source/drain electrodes 348 and 349 of the B sub-pixel 30B are formed on the interlayer insulating layer 330. The source/drain electrodes 342 and 343 of the R sub-pixel 30R are connected with the source/drain regions 312 and 313 through the contact holes 332 and 333. The source/drain electrodes 345 and 346 of the G sub-pixel 30G are connected with the source/drain regions 315 and 316 through the contact holes 335 and 336. The source/drain electrodes 348 and 349 of the B sub-pixel 30B are connected with the source/drain regions 318 and 317 through the contact holes 338 and 339.

Insulating layer patterns 351 and 354 are formed on the interlayer insulating layer 330 in the R and G sub-pixel regions 300R and 300G, respectively. The insulating layer pattern 351 is formed on a region of the interlayer insulating layer 330 corresponding with the emitting region of the R sub-pixel region 300R to adjust or change the chromaticity coordinates of R light generated in the R sub-pixel 30R. The insulating layer pattern 354 is formed on a region of the interlayer insulating layer 330 corresponding with the emitting region of the G sub-pixel region 300G to adjust or change the chromaticity coordinate of G light generated in the G sub-pixel 30G.

An anode electrode 361 of the R sub-pixel 30R is formed on or directly on the insulating layer pattern 351 in the R sub-pixel region 300R and is connected with the drain electrode 343 of the R sub-pixel 30R. Similarly, an anode electrode 364 of the G sub-pixel 30G is formed on or directly on the insulating layer pattern 354 in the G sub-pixel region 300G and is connected with the drain electrode 346 of the G sub-pixel 30G.

An anode electrode 367 of the B sub-pixel 30B is formed on or directly on the interlayer insulating layer 330 in the B sub-pixel region 300B and is connected with the drain electrode 349 of the B sub-pixel 30B. The insulating layer patterns 351 and 354 may be formed of a material that may be the same as or different from the material, for example, silicon nitride, used to form the protective layer 250 in the embodiments described above.

A pixel isolating layer 370 is formed on the substrate 300 above the interlayer insulating layer 330. The pixel isolating layer 370 includes an opening 371 exposing a portion of the anode electrode 361 of the R sub-pixel 30R, which is formed in the emitting region of the R sub-pixel region 300R, an opening 374 exposing a portion of the anode electrode 364 of the G sub-pixel 30G, which is formed in the emitting region of the G sub-pixel region 300G, and an opening 377 exposing a portion of the anode electrode 367 of the B sub-pixel 30B, which is formed in the emitting region of the B sub-pixel region 300B.

An organic layer 381 is formed on the portion of the anode electrode 361 of the R sub-pixel 30R that is exposed by the opening 371 in the R sub-pixel region 300R. Similarly, an organic layer 384 is formed on the portion of the anode electrode 364 of the G sub-pixel 30G that is exposed by the opening 374 in the G sub-pixel region 300G. Similarly, an organic layer 387 is formed on the portion of the anode electrode 367 of the B sub-pixel 30B that is exposed by the opening 377 in the B sub-pixel region 300B. A cathode electrode 390 is subsequently formed on the substrate 300 above the pixel isolating layer 370 as an upper electrode.

Each of the organic layers 381, 384, and 387 of the respective R, G, and B sub-pixels 30R, 30G, and 30B includes, for example, at least one of the following organic layers: a hole injecting layer, a hole transporting layer, an R, G, or B emissive layer, an electron transporting layer, an electron injecting layer, and a hole blocking layer.

As described above, referring to the embodiment shown in FIG. 3A, the R sub-pixel 30R having the R EL unit and the TFT is provided in the R sub-pixel region 300R. The R EL unit of the R sub-pixel 30R includes the anode electrode 361 formed on the insulating layer pattern 351 in the emitting region of the R sub-pixel region 300R, the organic layer 381, and the cathode electrode 390. The TFT of the R sub-pixel 30R includes the semiconductor layer 311, the gate electrode 321, and the source/drain electrodes 342 and 343, which are formed on the substrate 300 in the non-emitting region of the R sub-pixel region 300R. The drain electrode 343 is connected with the anode electrode 361 of the R EL unit.

Similarly, the G sub-pixel 30G having the G EL unit and the TFT is provided in the G sub-pixel region 300G. The G EL unit of the G sub-pixel 30G includes the anode electrode 364 formed on the insulating layer pattern 354 in the emitting region of the G sub-pixel region 300G, the organic layer 384, and the cathode electrode 390. The TFT of the G sub-pixel 30G includes the semiconductor layer 314, the gate electrode 324, and the source/drain electrodes 345 and 346, which are formed on the substrate 300 in the non-emitting region of the G sub-pixel region 300G. The drain electrode 346 is connected with the anode electrode 364 of the G EL unit.

The B sub-pixel 30B including the B EL unit and the TFT is provided in the B sub-pixel region 300B. The B EL unit of the B sub-pixel 30B includes the anode electrode 367 formed on the interlayer insulating layer 330 in the emitting region of the B sub-pixel region 300B, the organic layer 387, and the cathode electrode 390. The TFT of the B sub-pixel 30B includes the semiconductor layer 317, the gate electrode 327, and the source/drain electrodes 348 and 349, which are formed on the substrate 300 in the non-emitting region of the B sub-pixel region 300B. The drain electrode 349 is connected with the anode electrode 367 of the B EL unit.

Thus, the anode electrodes 361 and 364 of the R sub-pixel 30R and G sub-pixel 30G are formed on the insulating layer patterns 351 and 354, respectively. The anode electrode 367 of the B sub-pixel 30R is formed on a region of the interlayer insulating layer 330 in the emitting region of the B sub-pixel region 300B.

Light generated in the organic layers 381 and 384 of the R and G sub-pixels 30R and 30G emits toward the substrate 300 through the insulating layer patterns 351 and 354, respectively. However, in the B sub-pixel 30B, light generated in the organic layer 387 emits directly toward the substrate 300, e.g., the light is not emitted through the insulating layer pattern. Thus, by selectively forming the insulating layer patterns 351 and 354 under only the anode electrodes 361 and 364 of the respective R and G sub-pixels 351 and 354, the chromaticity area may be increased.

Further, it is understood that the chromaticity area may be increased by forming the insulating layer patterns 351 and 354 with varying thicknesses in the respective R and G sub-pixel regions 300R and 300G.

Figure 3B:
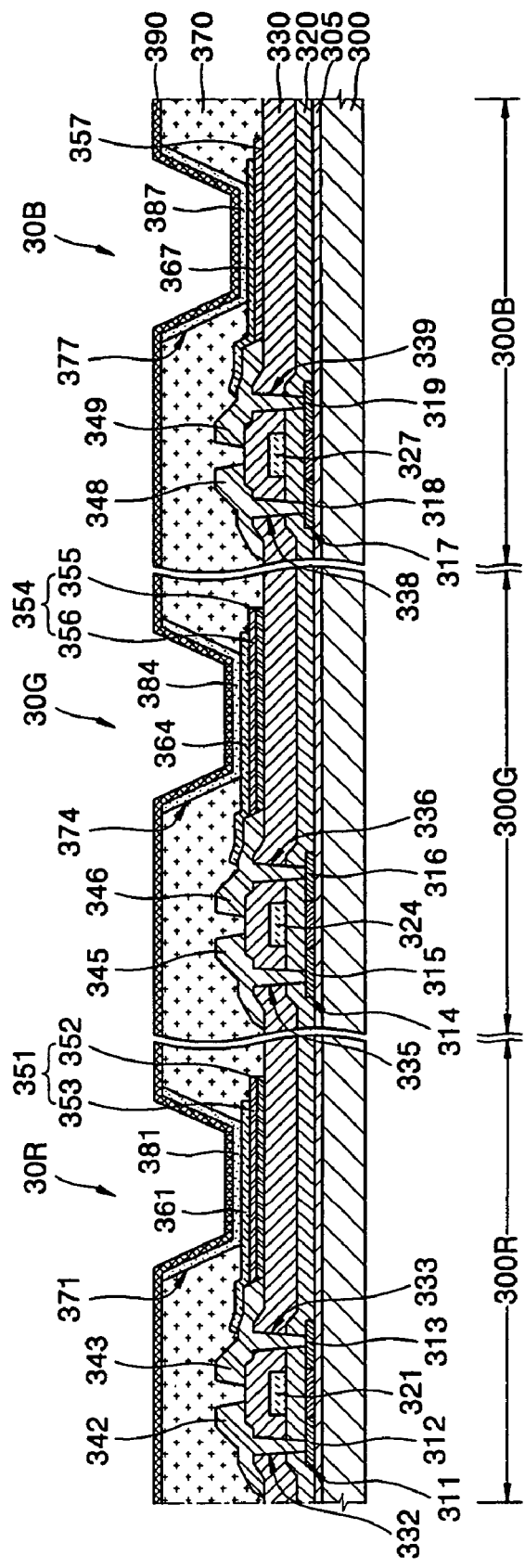
FIG. 3B is another sectional view of the organic EL display of FIG. 3A.

FIG. 3B is a sectional view of an organic EL display according to another embodiment of the present invention. In FIG. 3B, for purposes of convenience only an EL unit and a TFT are illustrated in each of R, G, and B sub-pixels that combine to form one pixel. The cross-section of the organic EL display in FIG. 3B is substantially the same as the cross-section of the organic EL display in FIG. 3A, except that the insulating layer pattern is a double layer structure.

Referring to FIG. 3B, the R, G, and B sub-pixels 30R, 30G, and 30B are formed in the R, G, and B sub-pixel regions 300R, 300G, and 300B of the substrate 300, respectively.

The R sub-pixel 30R in the R sub-pixel region 300R includes a TFT, which includes the semiconductor layer 311, the gate electrode 321, and the source/drain electrodes 342 and 343 formed in the non-emitting region of the R sub-pixel region 300R, and an R EL unit, which includes the anode electrode 361, the organic layer 381, and the cathode electrode 390 formed on the insulating layer pattern 351 in the emitting region of the R sub-pixel region 300R.

The G sub-pixel 30G in the G sub-pixel region 300G includes a TFT, which includes the semiconductor layer 314, the gate electrode 324, and the source/drain electrodes 345 and 346 formed in the non-emitting region of the G sub-pixel region 300G, and a G EL unit, which includes the anode electrode 364, the organic layer 384, and the cathode electrode 390 formed on the insulating layer pattern 354 in the emitting region of the G sub-pixel region 300G.

The B sub-pixel 30B in the B sub-pixel region 300B includes a TFT, which includes the semiconductor layer 317, the gate electrode 327, and the source/drain electrodes 348 and 349 formed in the non-emitting region of the B sub-pixel region 300B, and a B EL unit, which includes the anode electrode 367, the organic layer 387, and the cathode electrode 390 formed on the insulating layer pattern 357 in the emitting region of the B sub-pixel region 300B.

The insulating layer pattern 351 underlying or located beneath the anode electrode 361 of the R sub-pixel 30R includes a first insulating layer 352 formed on the interlayer insulating layer 330 and a second insulating layer 353 formed on the first insulating layer 352. Similarly, the insulating layer pattern 354 underlying or located beneath the anode electrode 364 of the G sub-pixel 30G includes a first insulating layer 355 formed on the interlayer insulating layer 330 and a second insulating layer 356 formed on the first insulating layer 355. The insulating layer pattern 357 of the B sub-pixel 30B includes only a single first insulating layer. The first insulating layers 352, 355, and 357 may be an insulating layer, such as an oxide layer, and the second protective layers 353 and 356 may be an insulating layer, such as a nitride layer, or vice-versa.

Thus, for example, the insulating layer patterns 351 and 354 underlying or located beneath the respective anode electrodes 361 and 364 of the R and G sub-pixels 30R and 30B may be formed on top of one another, for example, as a stack of the first and second insulating layers. The insulating layer pattern 357 underlying or located beneath the anode electrode 367 of the B sub-pixel 30B may be formed as a single first insulating layer.

Therefore, light generated in the organic layers 381 and 384 of the respective R and G sub-pixels 30R and 30G is emitted toward or at the substrate 300 through the insulating layer patterns 351 and 354 and light generated in the organic layer 387 of the B sub-pixel 30B is emitted toward the substrate 300 through the insulating layer pattern 357, which is only the first insulating layer.

It is understood that the anode electrode 367 in the B sub-pixel 30B may alternately be formed on or directly on the interlayer insulating layer 330 without including the insulating layer pattern 357.

According to the embodiment of the invention discussed above and shown in FIG. 3B, the organic EL display may be manufactured without requiring an additional masking process. For example, a masking process for forming via holes may be replaced with a masking process for forming the insulating layer patterns. Alternatively, by forming the insulating layer patterns using a halftone mask, the insulating layer patterns 351 and 354, which have a double layer structure, and the single layer insulating pattern 357 illustrated in FIG. 3B can be formed during a single masking process.

Figure 4A:
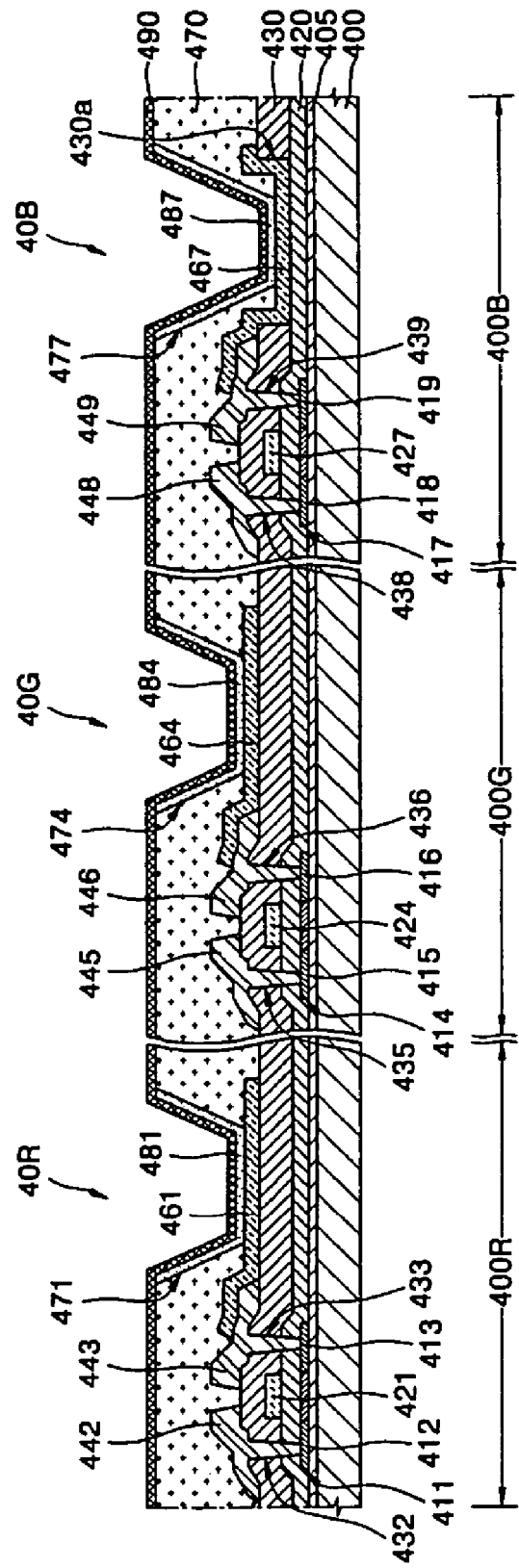
FIG. 4A is a sectional view of an organic EL display according to an embodiment of the invention.

FIG. 4A is a sectional view of an organic EL display according to another embodiment of the invention. In FIG. 4A, only an EL unit and a TFT are illustrated in each of R, G, and B sub-pixels 40R, 40G, and 40B.

In the organic EL displays described in the above embodiments discussed with reference to FIGS. 2A and 2B, a structure for superior chromaticity coordinates is obtained by selectively forming the protective layer in each of the R, G, and B sub-pixels 20R, 20G, and 20B. However, an organic EL display according to another embodiment of the invention is described below such that a structure for superior chromaticity coordinates is obtained by selectively forming an interlayer insulating layer in each of the R, G, and B sub-pixels.

Referring to FIG. 4A, for example, the organic EL display according to the present invention includes a plurality of pixels arranged in a matrix on a substrate 400. Each of the pixels includes an R sub-pixel 40R, a G sub-pixel 40G, and a B sub-pixel 40B. The R, G, and B sub-pixels 40R, 40G, and 40B are formed in R, G, and B sub-pixel regions 400R, 400G, and 400B on the substrate 400, respectively. Each of the R, G, and B sub-pixel regions 400R, 400G, and 400B includes an emitting region and a non-emitting region.

A buffer layer 405 is formed on the substrate 400, and semiconductor layers 411, 414, and 417 are formed on or directly on of the buffer layer 405 in the non-emitting regions of the R, G, and B sub-pixel regions 400R, 400G, and 400B, respectively. The semiconductor layer 411 includes p-type source/drain regions 412 and 413, the semiconductor layer 414 includes p-type source/drain regions 415 and 416, and the semiconductor layer 417 includes p-type source/drain regions 418 and 419.

A gate dielectric layer 420 is formed on the substrate 400. Gate electrodes 421, 424, and 427 of the respective R, G, and B sub-pixels 40R, 40G, and 40B are formed on the gate dielectric layer 420 in the respective R, G, and B sub-pixel regions 400R, 400G, and 400B. An interlayer insulating layer 430 is formed on the substrate 400. The interlayer insulating layer 430 may include an insulating layer, such as an oxide layer or a nitride layer.

The interlayer insulating layer 430 includes contact holes 432 and 433, exposing portions of the source/drain regions 412 and 413 of the R sub-pixel 40R, contact holes 435 and 436, exposing portions of the source/drain regions 415 and 416 of the G sub-pixel 40G, and contact holes 438 and 439, exposing portions of the source/drain regions 418 and 419 of the B sub-pixel 40B. The interlayer insulating layer 430 further includes an opening 430a, exposing a portion of the gate dielectric layer 420 corresponding to the emitting region of the B sub-pixel region 400B.

Source/drain electrodes 442 and 443 of the R sub-pixel 40R, source/drain electrodes 445 and 446 of the G sub-pixel 40G, and source/drain electrodes 448 and 449 of the B sub-pixel 40B are formed on or directly on the interlayer insulating layer 430. The source/drain electrodes 442 and 443 of the R sub-pixel 40R are connected with the source/drain regions 412 and 413 through the contact holes 432 and 433. Similarly, the source/drain electrodes 445 and 446 of the G sub-pixel 40G are connected with the source/drain regions 415 and 416 through the contact holes 435 and 436. Similarly, the source/drain electrodes 448 and 449 of the B sub-pixel 40B are connected to the source/drain regions 418 and 419 through the contact holes 438 and 439.

Anode electrodes 461, 464, and 467, which are pixel electrodes, of the respective R, G, and B sub-pixels 40R, 40G, and 40B are formed on or directly on the interlayer insulating layer 430. Specifically, the anode electrode 461 of the R sub-pixel 40R is formed on or directly on the interlayer insulating layer 430 and connects with the drain electrode 443. The anode electrode 464 of the G sub-pixel 40G is formed on or directly on the interlayer insulating layer 430 and connects with the drain electrode 446. The anode electrode 467 of the B sub-pixel 40B is formed in the opening 430a of the interlayer insulating layer 430 and connects with the is drain electrode 449.

A pixel isolating layer 470 is formed on the substrate 400 above portions of the interlayer insulating layer 430. The pixel isolating layer 470 includes an opening 471 exposing a portion of the anode electrode 461 of the R sub-pixel 40R, which is formed in the emitting region of the R sub-pixel region 400R, an opening 474 exposing a portion of the anode electrode 464 of the G sub-pixel 40G, which is formed in the emitting region of the G sub-pixel region 400G, and an opening 477 exposing a portion of the anode electrode 467 of the B sub-pixel 40B, which is formed in the emitting region of the B sub-pixel region 400B.

An organic layer 481 is formed on the portion of the anode electrode 461 of the R sub-pixel 40R that is exposed by the opening 471 in the R sub-pixel region 400R. Similarly, an organic layer 484 is formed on the portion of the anode electrode 464 of the G sub-pixel 40G that is exposed by the opening 474 in the G sub-pixel region 400G. Similarly, an organic layer 487 is formed on the portion of the anode electrode 467 of the B sub-pixel 40B that is exposed by the opening 477 in the B sub-pixel region 400B. A cathode electrode 490 is formed on the substrate 400 above the pixel isolating layer 470 as an upper electrode.

Each of the organic layers 481, 484, and 487 of the respective R, G, and B sub-pixels 40R, 40G, and 40B includes at least one of the following organic layers: a hole injecting layer, a hole transporting layer, an R, G, or B emissive layer, an electron transporting layer, an electron injecting layer, and a hole blocking layer.

According to an embodiment of the present invention described, with reference to FIG. 4A, the R EL unit of the R sub-pixel 40R includes the anode electrode 461 formed on the interlayer insulating layer 430 in the emitting region of the R sub-pixel region 400R, the organic layer 481, and the cathode electrode 490. The TFT of the R sub-pixel 40R includes the semiconductor layer 411, the gate electrode 421, and the source/drain electrodes 442 and 443, which are formed on the substrate 400 in the non-emitting region of the R sub-pixel region 400R. The drain electrode 443 is connected with the anode electrode 461 of the R EL unit.

Similarly, the G EL unit of the G sub-pixel 40G includes the anode electrode 464 formed on the interlayer insulating layer 430 in the emitting region of the G sub-pixel region 400G, the organic layer 484, and the cathode electrode 490. The TFT of the G sub-pixel 40G includes the semiconductor layer 414, the gate electrode 424, and the source/drain electrodes 445 and 446, which are formed on the substrate 400 in the non-emitting region of the G sub-pixel region 400G. The drain electrode 446 is connected with the anode electrode 464 of the G EL unit.

The B EL unit of the B sub-pixel 40B includes the anode electrode 467 formed on the gate dielectric layer 420 exposed by the opening 430a of the interlayer insulating layer 430 in the emitting region of the B sub-pixel region 400B, the organic layer 487, and the cathode electrode 490. The TFT of the B sub-pixel 40B includes the semiconductor layer 417, the gate electrode 427, and the source/drain electrodes 448 and 449, which are formed on the substrate 400 in the non-emitting region of the B sub-pixel region 400B. The drain electrode 449 is connected with the anode electrode 467 of the B EL unit.

Thus, the anode electrode 461 of the R sub-pixel 40R and the anode electrode 464 of the G sub-pixel 40G are formed on the interlayer insulating layer 430 in the emitting regions of the R and G sub-pixel regions 400R and 400G, respectively. The anode electrode 467 of the B sub-pixel 40B is formed on the gate dielectric layer 420 exposed by the opening 430a of the interlayer insulating layer 430 in the emitting region of the B sub-pixel region 400B.

Therefore, in the R and G sub-pixels 40R and 40G, light generated in the organic layers 481 and 484 is emitted toward or at the substrate 400 through the interlayer insulating layer 430. However, in the B sub-pixel 40B, light generated in the organic layer 487 is emitted toward or at the substrate 300 directly through the opening 430a of the interlayer insulating layer 430, i.e., not through the interlayer insulating layer 430.

Figure 4B:
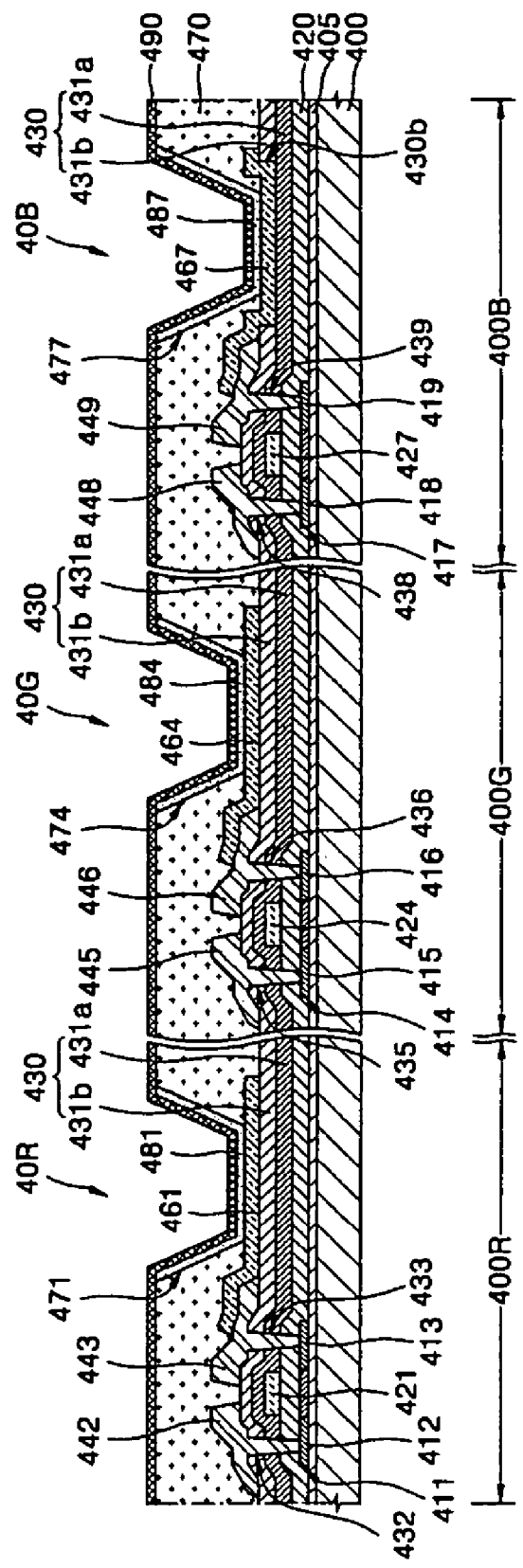
FIG. 4B is another sectional view of the organic EL display of FIG. 4A.

FIG. 4B is a sectional view of an organic EL display according to another embodiment of the invention. In FIG. 4B, for purposes of convenience, only an EL unit and a TFT are illustrated in each of R, G, and B sub-pixels 40R, 40G, and 40B that combine to form one pixel. The cross-section of the organic EL display in FIG. 4B is substantially the same as the cross-section of the organic EL display in FIG. 4A, except that the interlayer insulating layer is a double layer structure.

In the previously described embodiment with reference to FIG. 4A, the interlayer insulating layer 430 having a constant thickness is formed in the R and G sub-pixel regions 400R and 400G, and no interlayer insulating layer is formed in the B sub-pixel region 400B. However, it is understood that the chromaticity area may be increased by forming the interlayer insulating layer 430 with varying thicknesses in the respective R and G sub-pixel regions 400R and 400G.

Referring to FIG. 4B, the R, G, and B sub-pixels 40R, 40G, and 40B are formed in the R, G, and B sub-pixel regions 400R, 400G, and 400B of the substrate 400, respectively.

The R sub-pixel 40R in the R sub-pixel region 400R includes a TFT, which includes the semiconductor layer 411, the gate electrode 421, and the source/drain electrodes 442 and 443 formed in the non-emitting region of the R sub-pixel region 400R of the substrate 400, and an R EL unit, which includes the anode electrode 461 connected with the drain electrode 443, the organic layer 481, and the cathode electrode 490, which are formed on the interlayer insulating layer 430 in the emitting region of the R sub-pixel region 400R.

Similarly, the G sub-pixel 40G in the G sub-pixel region 400G includes a TFT, which includes the semiconductor layer 414, the gate electrode 424, and the source/drain electrodes 445 and 446 formed in the non-emitting region of the G sub-pixel region 400G of the substrate 400, and a G EL unit, which includes the anode electrode 464 connected with the drain electrode 446, the organic layer 484, and the cathode electrode 490, which are formed on the interlayer insulating layer 430 in the emitting region of the G sub-pixel region 400G.

The B sub-pixel 40B in the B sub-pixel region 400B includes a TFT, which includes the semiconductor layer 417, the gate electrode 427, and the source/drain electrodes 448 and 449 formed in the non-emitting region of the B sub-pixel region 400B of the substrate 400, and a B EL unit, which includes the anode electrode 467 connected with the drain electrode 446, the organic layer 487, and the cathode electrode 490, which are formed on the gate dielectric layer 420 exposed by the opening 430b of the interlayer insulating layer 430 in the emitting region of the B sub-pixel region 400B.

The interlayer insulating layer 430 is a multi-layer structure. For example, interlayer insulating layer 430 includes a first interlayer insulating layer 431a formed on or directly on the gate dielectric layer 420 and a second interlayer insulating layer 431b formed on or directly on the first interlayer insulating layer 431. The first interlayer insulating layer 431a may be an insulating layer, such as an oxide layer, and the second interlayer insulating layer 431b may be an insulating layer, such as a nitride layer, or vice-versa. The second interlayer insulating layer 431b includes the opening 430b, which exposes the portion of the gate dielectric layer 420 where the anode electrode 467 of the B sub-pixel 40B is formed.

According to an embodiment of the invention, the organic EL display shown in FIG. 4-B may be manufactured without an additional masking process. For example, the opening 430b and contact holes may be simultaneously formed in the interlayer insulating layer 430. Alternatively, the contact holes in the interlayer insulating layer 430 and the opening 430b in the second interlayer insulating layer 431b may be formed using, for example, a halftone mask.

The interlayer insulating layer 430 having the first interlayer insulating layer 431a and the second interlayer insulating layer 431b is formed below the anode electrodes 461 and 464 of the respective R and G sub-pixels 40R and 40G. In the B sub-pixel region 400B, the interlayer insulating layer 430 having the first interlayer insulating layer 431a and the second interlayer insulating layer 431b including the opening 430b is formed below the anode electrode 467 of the B sub-pixel 40b.

For example, the anode electrode 467 of the B sub-pixel 40B is formed in the emitting region of the B sub-pixel region 400B, e.g., in the opening 430b of the interlayer insulating layer 430. A portion of the anode electrode 467 of the B sub-pixel 40B corresponding with the organic layer 487 is formed on the first interlayer insulating layer 431a.

Light generated in the organic layers 481 and 484 of the respective R and G sub-pixels 40R and 40G is emitted toward or at the substrate 400 through the first interlayer insulating layer 431a and the second interlayer insulating layer 431b. Light generated in the organic layer 487 of the B sub-pixel 40B is emitted toward or at the substrate 400 only through the first interlayer insulating layer 431a, e.g., not through the second interlayer insulating layer 431b.

It is understood that the opening 430b may be formed through both the first interlayer insulating layer 431a and the second interlayer insulating layer 431b or the interlayer insulating layer 430.

Figure 5A:
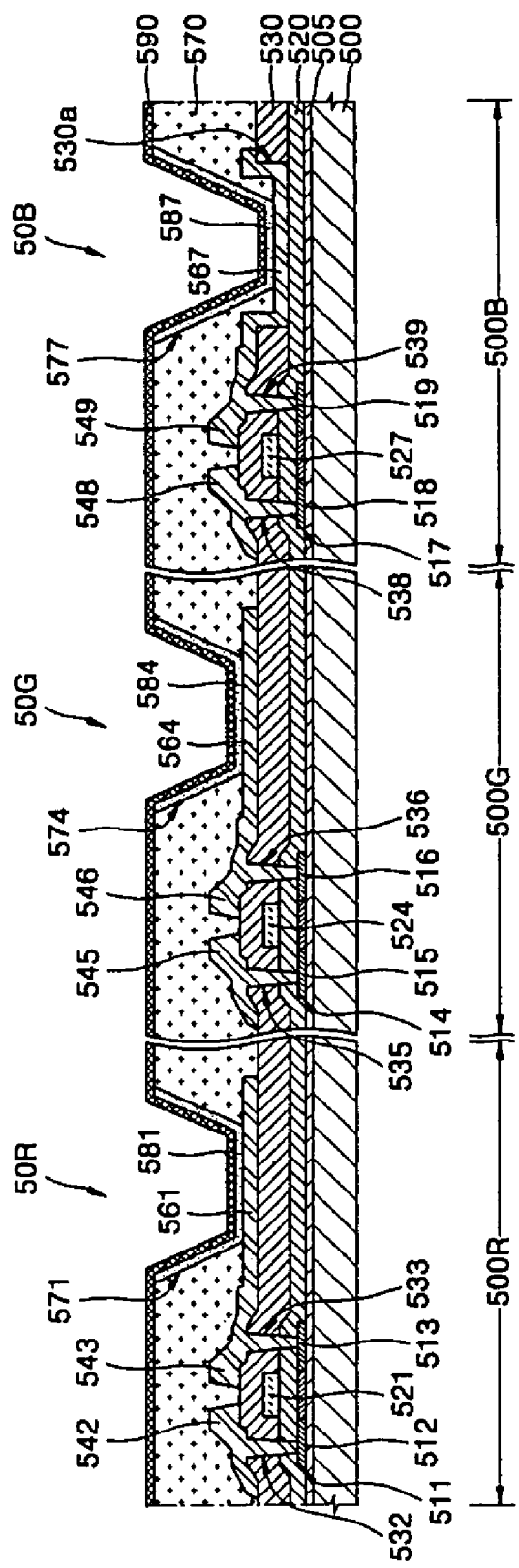
FIG. 5A is a sectional view of an organic EL display according to another embodiment of the invention.

FIG. 5A is a sectional view of an organic EL display according to an embodiment of the invention. In FIG. 5A, for purposes of convenience, only an EL unit and a TFT are illustrated in each of R, G, and B sub-pixels 50R, 50G, and 50B.

According to an embodiment of the invention described below, there is provided a structure for obtaining superior chromaticity coordinates by selectively forming the interlayer insulating layer in each of the R, G, and B sub-pixels 50R, 50G, and 50B.

Referring to FIG. 5A, the organic EL display includes a plurality of pixels arranged in a matrix or an array-type form on a substrate 500. An R sub-pixel 50R, a G sub-pixel 50G, and a B sub-pixel 50B are formed in R, G, and B sub-pixel regions 500 R, 500 G, and 500B on the substrate 500, respectively. Each of the R, G, and B sub-pixel regions 500R, 500G, and 500B includes an emitting region and a non-emitting region.

A buffer layer 505 is formed on the substrate 500, and semiconductor layers 511, 514, and 517 are formed on regions of the buffer layer 505 in the non-emitting regions of the R, G, and B sub-pixel regions 500R, 500G, and 500B, respectively. The semiconductor layer 511 for a TFT of the R sub-pixel 50R includes, for example, p-type source/drain regions 512 and 513, the semiconductor layer 514 for a TFT of the G sub-pixel 50G includes, for example, p-type source/drain regions 515 and 516, and the semiconductor layer 517 for a TFT of the B sub-pixel 50B includes, for example, p-type source/drain regions 518 and 519.

A gate dielectric layer 520 is formed on the substrate 500 above a buffer layer. Gate electrodes 521, 524, and 527 of the respective R, G, and B sub-pixels 50R, 50G, and 50B are formed on or directly on the gate dielectric layer 520 in the respective R, G, and B sub-pixel regions 500R, 500G, and 500B. An interlayer insulating layer 530 is formed on the substrate 500 above the gate dielectric layer 520. The interlayer insulating layer 530 may include an insulating layer, such as an oxide layer or a nitride layer, or vice-versa.

The interlayer insulating layer 530 includes contact holes 532 and 533 exposing portions of the source/drain regions 512 and 513 formed on the semiconductor layer 511 of the R sub-pixel 50R, contact holes 535 and 53 exposing portions of the source/drain regions 515 and 516 formed on the semiconductor layer 514 of the G sub-pixel 50G, and contact holes 538 and 539 exposing portions of the source/drain regions 518 and 519 formed on the semiconductor layer 517 of the B sub-pixel 50B.

Source/drain electrodes 542 and 543 of the R sub-pixel 50R, source/drain electrodes 545 and 546 of the G sub-pixel 50G, and source/drain electrodes 548 and 549 of the B sub-pixel 50B are formed on the interlayer insulating layer 530. Specifically, the source/drain electrodes 542 and 543 of the R sub-pixel 50R are respectively connected with the source/drain regions 512 and 513 through the contact holes 532 and 533. Similarly, the source/drain electrodes 545 and 546 of the G sub-pixel 50G are respectively connected with the source/drain regions 515 and 516 through the contact holes 535 and 536. Similarly, the source/drain electrodes 548 and 549 of the B sub-pixel 50B are respectively connected with the source/drain regions 518 and 519 through the contact holes 538 and 539.

Anode electrodes 561, 564, and 567, which are pixel electrodes, of the respective R, G, and B sub-pixels 50R, 50G, and 50B are formed on the interlayer insulating layer 530. The anode electrodes 561, 564, and 567 may be made of the same material as the material that the drain electrodes 543, 546, and 549 are made of.

In a rear emission type organic EL display, the drain electrodes may be transparent electrodes made of, for example, a transparent conductive material. Further, the drain electrodes 543, 546, and 549 may be made of a material that is the same as or different from the material that the source electrodes 542, 545, and 548 are made of.

For example, as shown in FIG. 5A, the anode electrode 561 of the R sub-pixel 50R extends from the drain electrode 543, the anode electrode 564 of the G sub-pixel 50G extends from the drain electrode 546, and the anode electrode 567 of the B sub-pixel 50B extends from the drain electrode 549.

A pixel isolating layer 570 is formed on the substrate 500 above the interlayer insulating layer 530. The pixel isolating layer 570 includes an opening 571 exposing a portion of the anode electrode 561 of the R sub-pixel 50R, which is formed in the emitting region of the R sub-pixel region 500R, an opening 574 exposing a portion of the anode electrode 564 of the G sub-pixel 50G, which is formed in the emitting region of the G sub-pixel region 500G, and an opening 577 exposing a portion of the anode electrode 567 of the B sub-pixel 50B, which is formed in the emitting region of the B sub-pixel region 500B.

An organic layer 581 is formed on the portion of the anode electrode 561 of the R sub-pixel 50R that is exposed by the opening 571 in the R sub-pixel region 500R. Similarly, an organic layer 584 is formed on the portion of the anode electrode 564 of the G sub-pixel 50G that is exposed by the opening 574 in the G sub-pixel region 500G. An organic layer 587 is formed on the portion of the anode electrode 567 of the B sub-pixel 50B that is exposed by the opening 577 in the B sub-pixel region 500B. A cathode electrode 590 is formed on the substrate 500 as an upper electrode.

Each of the organic layers 581, 584, and 587 of the respective R, G, and B sub-pixels 50R, 50G, and 50B includes, for example, at least one of the following organic layers: a hole injecting layer, a hole transporting layer, an R, G, or B emissive layer, an electron transporting layer, an electron injecting layer, and a hole blocking layer.

As described above, referring to the embodiment of the invention shown and described with reference to FIG. 5A, the R EL unit of the R sub-pixel 50R includes the anode electrode 561 extending from the drain electrode 543, the organic layer 581, and the cathode electrode 590, which are formed or directly on the interlayer insulating layer 530 in the emitting region of the R sub-pixel region 400R. The TFT of the R sub-pixel 50R includes the semiconductor layer 511, the gate electrode 521, and the source/drain electrodes 542 and 543, which are formed on the substrate 500 in the non-emitting region of the R sub-pixel region 500R.

Similarly, the G EL unit of the G sub-pixel 50G includes the anode electrode 564 extending from the drain electrode 546, the organic layer 584, and the cathode electrode 590, which are formed on or directly on the interlayer insulating layer 530 in the emitting region of the G sub-pixel region 500G. The TFT of the G sub-pixel 50G includes the semiconductor layer 514, the gate electrode 524, and the source/drain electrodes 545 and 546, which are formed on the substrate 500 in the non-emitting region of the G sub-pixel region 500G.

The B EL unit of the B sub-pixel 50B includes the anode electrode 567, the organic layer 587, and the cathode electrode 490 formed on or directly on the gate dielectric layer 520 exposed by the opening 530a of the interlayer insulating layer 530 in the emitting region of the B sub-pixel region 500B. The TFT of the B sub-pixel 50B includes the semiconductor layer 517, the gate electrode 527, and the source/drain electrodes 548 and 549, which are formed on the substrate 500 in the non-emitting region of the B sub-pixel region 500B.

Thus, the anode electrode 561 of the R sub-pixel 50R and the anode electrode 564 of the G sub-pixel 50G are formed on or directly on the interlayer insulating layer 530 in the emitting regions of the R and G sub-pixel regions 500R and 500G, respectively. The anode electrode 567 of the B sub-pixel 50B is formed on a portion of the gate dielectric layer 520 exposed by the opening 530a of the interlayer insulating layer 530 in the emitting region of the B sub-pixel region 500B.

Therefore, in the R and G sub-pixels 50R and 50G, light generated in the organic layers 581 and 584 is emitted toward or at the substrate 500 through the interlayer insulating layer 530. In the B sub-pixel 50B, light generated in the organic layer 587 is emitted toward or at the substrate 500 directly through the opening 530a of the interlayer insulating layer 530.

It is understood that the chromaticity area may be increased by forming the interlayer insulating layer 530 with varying thicknesses in the respective R and G sub-pixel regions 500R and 500B.

Figure 5B:
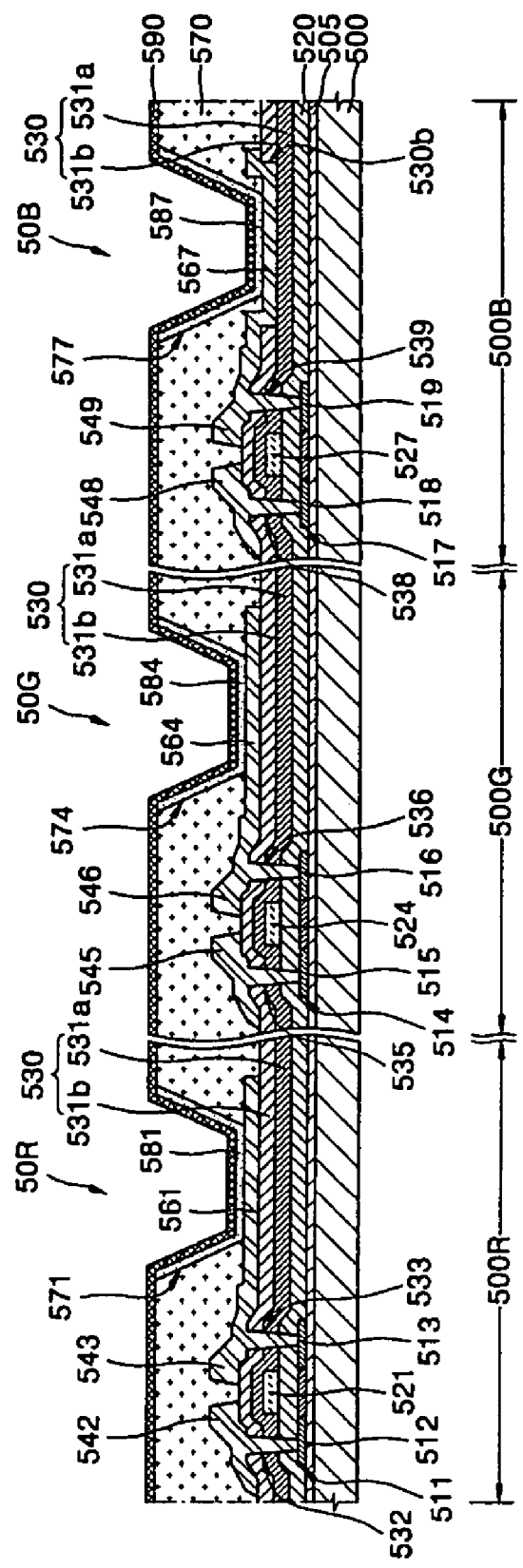
FIG. 5B is another sectional view of the organic EL display of FIG. 5A.

FIG. 5B is a sectional view of an organic EL display according to another embodiment of the invention. In FIG. 5B, for purposes of convenience only an EL unit and a TFT are illustrated in each of R, G, and B sub-pixels that combine to form one pixel. The cross-section of the organic EL display in FIG. 5B is substantially the same as the cross-section of the organic EL display shown in FIG. 5A, except that the interlayer insulating layer is a double layer structure.

Referring to FIG. 5B, the R, G, and B sub-pixels 50R, 50G, and 50B are formed in the R, G, and B sub-pixel regions 500R, 500G, and 500B of the substrate 500, respectively.

The R sub-pixel 5 OR in the R sub-pixel region 500R includes a TFT, which includes the semiconductor layer 511, the gate electrode 521, and the source/drain electrodes 542 and 543 formed in the non-emitting region of the R sub-pixel region 500R of the substrate 500, and an R EL unit, which includes the anode electrode 561 extending from the drain electrode 543, the organic layer 581, and the cathode electrode 590, which are formed on or above the interlayer insulating layer 530 in the emitting region of the R sub-pixel region 500R.

Similarly, the G sub-pixel 50G in the G sub-pixel region 500G includes a TFT, which includes the semiconductor layer 514, the gate electrode 524, and the source/drain electrodes 545 and 546 formed in the non-emitting region of the G sub-pixel region 500G of the substrate 500, and a G EL unit, which includes the anode electrode 564 extending from the drain electrode 546, the organic layer 584, and the cathode electrode 590, which are formed on or above the interlayer insulating layer 530 in the emitting region of the G sub-pixel region 500G.

The B sub-pixel 50B in the B sub-pixel region 500B includes a TFT, which includes the semiconductor layer 517, the gate electrode 527, and the source/drain electrodes 548 and 549 formed in the non-emitting region of the B sub-pixel region 500B of the substrate 500, and a B EL unit, which includes the anode electrode 567 extending from the drain electrode 549, the organic layer 587, and the cathode electrode 590, which are formed on or above a portion of the gate dielectric layer 520 exposed by the opening 530b of the interlayer insulating layer 530 in the emitting region of the B sub-pixel region 500B.

The interlayer insulating layer 530 includes a first interlayer insulating layer 531a formed on the gate dielectric layer 520 and a second interlayer insulating layer 531b formed on the first interlayer insulating layer 531a. The second interlayer insulating layer 531b has the opening 530b, exposing the portion of the gate dielectric layer 520 where the anode electrode 567 of the B sub-pixel 50B is formed. The first interlayer insulating layer 531a may be an insulating layer, such as an oxide layer, and the second interlayer insulating layer 531a may be an insulating layer, such as a nitride layer, or vice-versa.

The interlayer insulating layer 530 is formed below the anode electrodes 561 and 564 of the respective R and G sub-pixels 50R and 50B and includes a stacked arrangement of the first interlayer insulating layer 531a and the second interlayer insulating layer 531b, e.g., the first interlayer insulating layer 531a and the second interlayer insulating layer 531b are formed or provided on top of one another. The interlayer insulating layer 530 formed below or underneath the anode electrode 547 of the B sub-pixel 50B includes the first interlayer insulating layer 531a and the second interlayer insulating layer 531b including the opening 530b in a region corresponding to the organic layer 587.

Therefore, light generated in the organic layers 581 and 584 of the respective R and G sub-pixels 50R and 50G is emitted toward or at the substrate 500 through the first interlayer insulating layer 531a and the second interlayer insulating layer 531b, and light generated in the organic layer 587 of the B sub-pixel 50B is emitted toward or at the substrate 500 only through the first interlayer insulating layer 531a, e.g., not through the second interlayer insulating layer 531b.

It is understood that the opening 530b may be formed through either or both of the first interlayer insulating layer 531a and the second interlayer insulating layer 531b.

According to an embodiment of the invention, the organic EL displays described with reference to FIG. 5A and FIG. 5B may be manufactured without an additional masking process. For example, contact holes in the interlayer insulating layer 530 and the opening 530b may be simultaneously formed in the B sub-pixel region 500B. Alternatively, when forming the contact holes in the interlayer insulating layer 530, the opening 530b may instead only be formed in the second interlayer insulating layer 531b of the interlayer insulating layer 530 by using, for example, a halftone mask.

It is understood that the protective layer may be formed as a multi-layer that includes more than two layers. In such an embodiment, the protective layer may be selectively formed in each of the R, G, and B sub-pixels to obtain superior or improved chromaticity coordinates. Alternatively, the multi-layered protective layer may be selectively formed with varying thicknesses in the respective R, G, and B sub-pixels.

Although in the embodiments of the invention discussed above, the first and second protective layers of the interlayer insulating layer are described as being made of either an oxide or a nitride, it is understood that the invention is not limited to such material. For example, one of the first and second protective layers may be an organic insulating layer, and the other may be an inorganic insulating layer.

Although in the embodiments of the present invention described above, the p-type TFT is disclosed as being a driving unit for an EL unit, an n-type TFT or other switching device may be used as the driving unit.

Although in the embodiments of the present invention described above, the insulating layer, such as the interlayer insulating layer or the protective layer, formed below the anode electrodes, which are pixel electrodes, are selectively formed in each of the R, G, and B sub-pixels to obtain superior or improved chromaticity coordinates, all or some of the insulating layers including, for example, the interlayer insulating layer, the protective layer, the gate dielectric layer, and the buffer layer, which underlay or are formed below the anode electrodes, may be selectively formed in each of the R, G, and B sub-pixels.

Although the embodiments of the invention described above refer mostly to active matrix type organic EL displays, which include an organic EL unit as a display unit and a TFT as a driving unit for the EL unit, the chromaticity coordinates in an active matrix type liquid crystal display (LCD), which include an LCD unit as a display unit and a TFT as a driving unit for the LCD unit, may be improved by selectively removing the insulating layer provided or formed below the pixel electrode in each of the R, G, and B sub-pixels.

According to another embodiment of the invention, superior or improved R, G, and B chromaticity coordinates can be obtained in an active matrix type organic EL display by selectively removing the insulating layer underlying the pixel electrode of each of the R, G, and B sub-pixels, thereby reducing power consumption.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display comprising: a substrate including a plurality of sub-pixel regions, each of the sub-pixel regions comprises an emitting region and a non-emitting region and emits a predetermined color of light; a driving unit provided in the non-emitting region of each sub-pixel region; a pixel electrode provided in the emitting region of each sub-pixel region and connected with the driving unit; and an insulating layer provided under the pixel electrodes, wherein the insulating layer is provided on an entire surface of the substrate except for one of the emitting regions of the sub-pixel regions, and wherein the insulating layer is provided in more than one of the emitting regions of the sub-pixel regions.

2. The flat panel display of claim 1, wherein the insulating layer is a single layer or a multi-layer structure comprising a nitride layer or an oxide layer.

3. The flat panel display of claim 1, wherein the plurality of sub-pixel regions comprises an R sub-pixel region having a R sub-pixel emitting red light, a G sub-pixel region having a G sub-pixel emitting green light, and a B sub-pixel region having a B sub-pixel emitting blue light, and
wherein the insulating layer is provided on an entire surface of the substrate except for a region corresponding to the emitting region of the B sub-pixel region.

4. The flat panel display of claim 3, wherein the insulating layer is a single layer or a multi-layer structure comprising a nitride layer and/or an oxide layer.

5. The flat panel display of claim 3, wherein the insulating layer comprises:
a first insulating layer provided on the entire surface of the substrate; and
a second insulating layer provided on an entire surface of the first insulating layer except for a region corresponding to the emitting region of the B sub-pixel region.

6. The flat panel display of claim 5, wherein the first insulating layer comprises an oxide layer, and the second insulating layer comprises a nitride layer.

7. The flat panel display of claim 1, wherein the plurality of sub-pixel regions comprises an R sub-pixel region having a R sub-pixel emitting red light, a G sub-pixel region having a G sub-pixel emitting green light, and a B sub-pixel region having a B sub-pixel emitting blue light, and
wherein the insulating layer is an insulating layer pattern provided in only the emitting regions of the R and G sub-pixel regions.

8. The flat panel display of claim 7, wherein the insulating layer is a single layer or a multi-layer structure comprising a nitride layer and/or an oxide layer.

9. The flat panel display of claim 7, wherein the insulating layer pattern comprises:
a first insulating layer provided in the emitting regions of the R and G sub-pixel regions; and
a second insulating layer provided on the first insulating layer.

10. The flat panel display of claim 9, wherein the first insulating layer comprises an oxide layer, and the second insulating layer comprises a nitride layer.

11. The flat panel display of claim 10, wherein the first insulating layer is formed in the emitting region of the B sub-pixel region.

12. The flat panel display of claim 1, wherein each of the driving units comprises a driving thin film transistor for driving each of the pixel electrodes.

13. A flat panel display comprising: a substrate including R, G, and B sub-pixel regions, each of the R, G, and B sub-pixel regions comprises an emitting region and a non-emitting region; R, G, and B pixel electrodes provided in the respective emitting regions of the R, G, and B sub-pixel regions; R, G, and B driving units provided in the respective non-emitting regions of the R, G, and B sub-pixel regions and driving the respective R, G, and B pixel electrodes; and an insulating layer provided between the R, G, and B driving units and the R, G, and B pixel electrodes, wherein the insulating layer is provided on an entire surface of the substrate except for one of the emitting regions of the R, G, and B sub-pixel regions, and wherein the insulating layer is provided in more than one of the emitting regions of the R, G, and B sub-pixel regions.

14. The flat panel display of claim 13, wherein the insulating layer is a single layer or a multi-layer structure comprising a nitride layer and/or an oxide layer.

15. The flat panel display of claim 13, wherein the insulating layer is provided on the entire surface of the substrate except for the emitting region of the B sub-pixel region.

16. The flat panel display of claim 13, wherein the insulating layer comprises:
a first insulating layer provided on the entire surface of the substrate; and
a second insulating layer provided on an entire surface of the first insulating layer except for a region corresponding to the emitting region of the B sub-pixel region.

17. The flat panel display of claim 16, wherein the first insulating layer comprises an oxide layer, and the second insulating layer comprises a nitride layer.

18. The flat panel display of claim 13, wherein the insulating layer is an insulating layer pattern provided in only the emitting regions of the R and G sub-pixel regions.

19. The flat panel display of claim 18, wherein the insulating layer pattern comprises:
a first insulating layer provided in the emitting regions of the R and G sub-pixel regions; and
a second insulating layer provided on the first insulating layer.

20. The flat panel display of claim 19, wherein the first insulating layer comprises an oxide layer, and the second insulating layer comprises a nitride layer.

21. The flat panel display of claim 13, wherein the first insulating layer is provided in the emitting region of the B sub-pixel region.

22. A flat panel display comprising: a substrate including R, G, and B sub-pixel regions, each of the R, G, and B sub-pixel regions comprises an emitting region and a non-emitting region; R, G, and B pixel electrodes provided in the respective emitting regions of the R, G, and B sub-pixel regions; R, G, and B driving units provided in the respective non-emitting regions of the R, G, and B sub-pixel regions, each of the R, G, and B sub-pixel regions comprising driving electrodes to drive respective R, G, and B pixel electrodes; and an insulating layer provided on the substrate and having the driving electrodes formed thereon, wherein the R, G, and B pixel electrodes are provided on the insulating layer and are connected with the respective driving electrodes, and wherein the insulating layer is provided on an entire surface of the substrate except for one of the insulating layer is provided on an entire surface of the substrate except for one of the emitting regions of the R, G, and B sub-pixel region, and wherein the insulating layer is provided in more than one of the emitting regions of the R, G, and B sub-pixel regions.

23. The flat panel display of claim 22, wherein the insulating layer is provided on the entire surface of the substrate except for a region corresponding to the emitting region of the B sub-pixel region.

24. The flat panel display of claim 22, wherein the insulating layer comprises:
a first insulating layer provided on the entire surface of the substrate; and
a second insulating layer provided on an entire surface of the first insulating layer except for a region corresponding to the emitting region of the B sub-pixel region.

25. The flat panel display of claim 24, wherein the first insulating layer comprises an oxide layer, and the second insulating layer comprises a nitride layer.

26. The flat panel display of claim 22, wherein the insulating layer is a single layer or a multi-layer structure comprising a nitride layer and/or an oxide layer.

27. An organic electroluminescence display comprising: a substrate including R, G, and B sub-pixel regions, each of the R, G, and B sub-pixel regions comprises an emitting region and a non-emitting region; R, G, and B thin film transistors provided in the respective non-emitting regions of the R, G, and B sub-pixel regions, each of the R, G, and B thin film transistors comprises a semiconductor layer, a gate electrode, and source/drain electrodes; an insulating layer including R, G, and B via holes exposing one of the source/drain electrodes of the respective R, G, and B thin film transistors; and R, G, and B electroluminescence units formed in the respective emitting regions of the R, G, and B sub-pixel regions and comprising R, G, and B pixel electrodes, respectively, which are connected with one of the source/drain electrodes of the respective R, G, and B thin film transistors through the respective R, G, and B via holes, wherein the insulating layer is provided on an entire surface of the substrate except for one of the emitting regions of the R, G, and B sub-pixel regions, and wherein the insulating layer is provided in more than one of the emitting regions of the R, G, and B sub-pixel regions.

28. The organic electroluminescence display of claim 27, wherein the insulating layer is provided on the entire surface of the substrate except for a region below the B pixel electrode in the emitting region of the B sub-pixel region, and wherein the insulating layer is a single layer or a multi-layer structure comprising a nitride layer and/or an oxide layer.

29. The organic electroluminescence display of claim 27, wherein the insulating layer comprises:

a first insulating layer formed on the entire surface of the substrate; and a second insulating layer formed on an entire surface of the first insulating layer except for a region below the B pixel electrode in the emitting region of the B sub-pixel region, wherein the first insulating layer comprises an oxide layer, and the second insulating layer comprises a nitride layer.

30. An organic electroluminescence display comprising:

a substrate including R, G, and B sub-pixel regions, each of the R, G, and B sub-pixel regions comprising an emitting region and a non-emitting region;

R, G, and B thin film transistors provided in the respective non-emitting regions of the R, G, and B sub-pixel regions, each of the R, G, and B thin film transistors comprising a semiconductor layer, a gate electrode, and source/drain electrodes;

R, G, and B electroluminescence units provided in the respective emitting regions of the R, G, and B sub-pixel regions and comprising R, G, and B pixel electrodes, respectively, which are connected with one of the source/drain electrodes of the respective R, G, and B thin film transistors;

an organic layer selectively provided in the emitting regions on the R, G, and B pixel electrodes; and an insulating layer selectively provided below only the R and G pixel wherein the insulating layer is multi-layer structure comprising a nitride layer and/or an oxide layer, and wherein the thickness of the insulating layer below the R pixel electrode is equal to the thickness of the insulating layer below the G pixel.

31. The organic electroluminescence display of claim 30, wherein the insulating layer comprises:

a first insulating layer provided below the R and G pixel electrodes; and a second insulating layer provided on the first insulating layer, wherein the first insulating layer comprises an oxide layer, and the second insulating layer comprises a nitride layer.

32. An organic electroluminescence display comprising: a substrate including R, G, and B sub-pixel regions, each of the sub-pixel regions comprising an emitting region and a non-emitting region; R, G, and B thin film transistors provided in the respective non-emitting regions of the R, G, and B sub-pixel regions, each of the R, G, and B thin film transistors comprising a semiconductor layer, a gate electrode, and source/drain electrodes; R, G, and B electroluminescence units provided in the respective emitting regions of the R, G, and B sub-pixel regions and including R, G, and B pixel electrodes, respectively, which are connected with one of the source/drain electrodes of the respective R, G, and B thin film transistors; and an insulating layer formed below the source/drain electrodes, wherein the R, G, and B pixel electrodes are provided on the insulating layer and are connected with the one of the source/drain electrodes of the respective R, G, and B thin film transistors, and wherein the insulating layer is provided on an entire surface of the substrate except for one of the emitting regions of the R, G, and B sub-pixel regions, and wherein the insulating layer is provided in more than t one of the emitting regions of the R, G, and B sub-pixel regions.

33. The organic electroluminescence display of claim 32, wherein the insulating layer is formed on the entire surface of the substrate except for a region below the B pixel electrode in the emitting region of the B sub-pixel region, and wherein the insulating layer is a single layer or a multi-layer structure comprising a nitride layer and/or an oxide layer.

34. The organic electroluminescence display of claim 32, wherein the insulating layer comprises:

a first insulating layer provided on the entire surface of the substrate; and a second insulating layer formed on an entire surface of the first insulating layer except for a region below the B pixel electrode in the emitting region of the B sub-pixel region, wherein the first insulating layer comprises an oxide layer, and the second insulating layer comprises a nitride layer.

35. An organic electroluminescence display comprising: a substrate including R, G, and B sub-pixel regions, each of the sub-pixel regions comprising an emitting region and a non-emitting region; R, G, and B thin film transistors provided in the respective non-emitting regions of the R, G, and B sub-pixel regions, each of the R, G, and B thin film transistors comprising a semiconductor layer, a gate electrode, and source/drain electrodes; R, G, and B electroluminescence units provided in the respective emitting regions of the R, G, and B sub-pixel regions and comprising R, G, and B pixel electrodes, respectively; and an insulating layer provided below the source/drain electrodes of the R, G, and B thin film transistors, wherein the R, G, and B pixel electrodes extend from one of the source/drain electrodes of the respective R, G, and B thin film transistors, and wherein the insulating layer is formed on an entire surface of the substrate except for at least one of the emitting regions of the R, G, and B sub-pixel regions, and substrate except for one of the emitting regions of the R, G, and B sub-pixel regions, and wherein the insulating layer is provided in more than one of the emitting regions of the R, G, sub-pixel regions.

36. The organic electroluminescence display of claim 35, wherein the insulating layer is provided on the entire surface of the substrate except for a region below the B pixel electrode in the emitting region of the B sub-pixel region, and wherein the insulating layer is a single layer and/or a multi-layer structure comprising a nitride layer and/or an oxide layer.

37. The organic electroluminescence display of claim 35, wherein the insulating layer comprises:
   a first insulating layer formed on the entire surface of the substrate; and
   a second insulating layer formed on an entire surface of the first insulating layer except for a region under the B pixel electrode in the emitting region of the B sub-pixel region,
   wherein the first insulating layer comprises an oxide layer, and the second insulating layer comprises a nitride layer.

38. A method of forming a flat panel display comprising: forming a plurality of sub-pixel regions on a substrate, each of the sub-pixel regions include comprises an emitting region and a non-emitting region and emits a predetermined color of light; forming a driving unit in the non-emitting region of each sub-pixel region; forming a pixel electrodes in the emitting region of each sub-pixel region and connecting each pixel electrode with driving unit; and forming an insulating layer under the pixel electrodes on an entire surface of the substrate except for one of the emitting regions of the sub-pixel regions, wherein the insulating layer is formed in more than one of the emitting regions of the sub-pixel regions.

39. The method of forming the flat panel display of claim 38, wherein the plurality of sub-pixel regions comprises an R sub-pixel region having a R sub-pixel emitting red light, a G sub-pixel region having a G sub-pixel emitting green light, and a B sub-pixel region having a B sub-pixel emitting blue light, and
   wherein the insulating layer is provided on an entire surface of the substrate except for a region corresponding to the emitting region of the B sub-pixel region.

40. The method of forming the flat panel display of claim 39, wherein the insulating layer comprises:
   a first insulating layer provided on the entire surface of the substrate; and
   a second insulating layer provided on an entire surface of the first insulating layer except for a region corresponding to the emitting region of the B sub-pixel region.

* * * * *